(12) United States Patent
Philippou et al.

(10) Patent No.: US 10,978,560 B2
(45) Date of Patent: Apr. 13, 2021

(54) POWER SEMICONDUCTOR DEVICE WITH DV/DT CONTROLLABILITY AND LOW GATE CHARGE

(71) Applicant: Infineon Technologies AG, Neubiberg (DE)

(72) Inventors: Alexander Philippou, Munich (DE); Roman Baburske, Otterfing (DE); Christian Jaeger, Munich (DE); Johannes Georg Laven, Taufkirchen (DE); Helmut Maeckel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/368,638

(22) Filed: Mar. 28, 2019

(65) Prior Publication Data
US 2019/0305087 A1    Oct. 3, 2019

(30) Foreign Application Priority Data

Mar. 29, 2018  (DE) .......................... 102018107568.5

(51) Int. Cl.
| | | |
|---|---|---|
| *H01L 29/06* | (2006.01) | |
| *H01L 29/78* | (2006.01) | |
| *H01L 29/66* | (2006.01) | |
| *H01L 29/739* | (2006.01) | |
| *H01L 29/10* | (2006.01) | |
| *H01L 29/423* | (2006.01) | |
| *H01L 29/08* | (2006.01) | |

(52) U.S. Cl.
CPC ...... *H01L 29/1083* (2013.01); *H01L 29/0696* (2013.01); *H01L 29/0869* (2013.01); *H01L 29/4236* (2013.01); *H01L 29/66348* (2013.01); *H01L 29/66734* (2013.01); *H01L 29/7397* (2013.01); *H01L 29/7813* (2013.01)

(58) Field of Classification Search
CPC ............. H01L 29/0696; H01L 29/7813; H01L 29/4236; H01L 29/7455; H01L 29/7397; H01L 29/28017; H01L 29/0839; H01L 29/102; H01L 20/1095; H01L 29/4238; H01L 29/6634; H01L 29/66363
See application file for complete search history.

(56) References Cited

U.S. PATENT DOCUMENTS

| | | |
|---|---|---|
| 5,864,159 A | 1/1999 | Takahashi |
| 2001/0008788 A1* | 7/2001 | Hshieh ................ H01L 29/4916 438/270 |

(Continued)

FOREIGN PATENT DOCUMENTS

JP        2014135419 A       7/2014

*Primary Examiner* — Galina G Yushina
(74) *Attorney, Agent, or Firm* — Murphy, Bilak & Homilier, PLLC

(57) ABSTRACT

A power semiconductor device having a barrier region is provided. A power unit cell of the power semiconductor device has at least two trenches that may both extend into the barrier region. The at least two trenches may both have a respective trench electrode coupled to a control terminal of the power semiconductor device. For example, the trench electrodes are structured to reduce the total gate charge of the power semiconductor device. The barrier region may be p-doped and vertically confined, i.e., in and against the extension direction, by the drift region. The barrier region can be electrically floating.

17 Claims, 18 Drawing Sheets

(56) References Cited

U.S. PATENT DOCUMENTS

| | | | |
|---|---|---|---|
| 2003/0102486 A1* | 6/2003 | Inoue | H01L 29/66348 257/139 |
| 2008/0258208 A1* | 10/2008 | Hirler | H01L 29/861 257/328 |
| 2009/0272982 A1* | 11/2009 | Nakamura | H01L 29/66068 257/77 |
| 2014/0015046 A1* | 1/2014 | Thiele | H03K 17/0822 257/334 |
| 2017/0018637 A1* | 1/2017 | Kitamura | H01L 29/0634 |

* cited by examiner

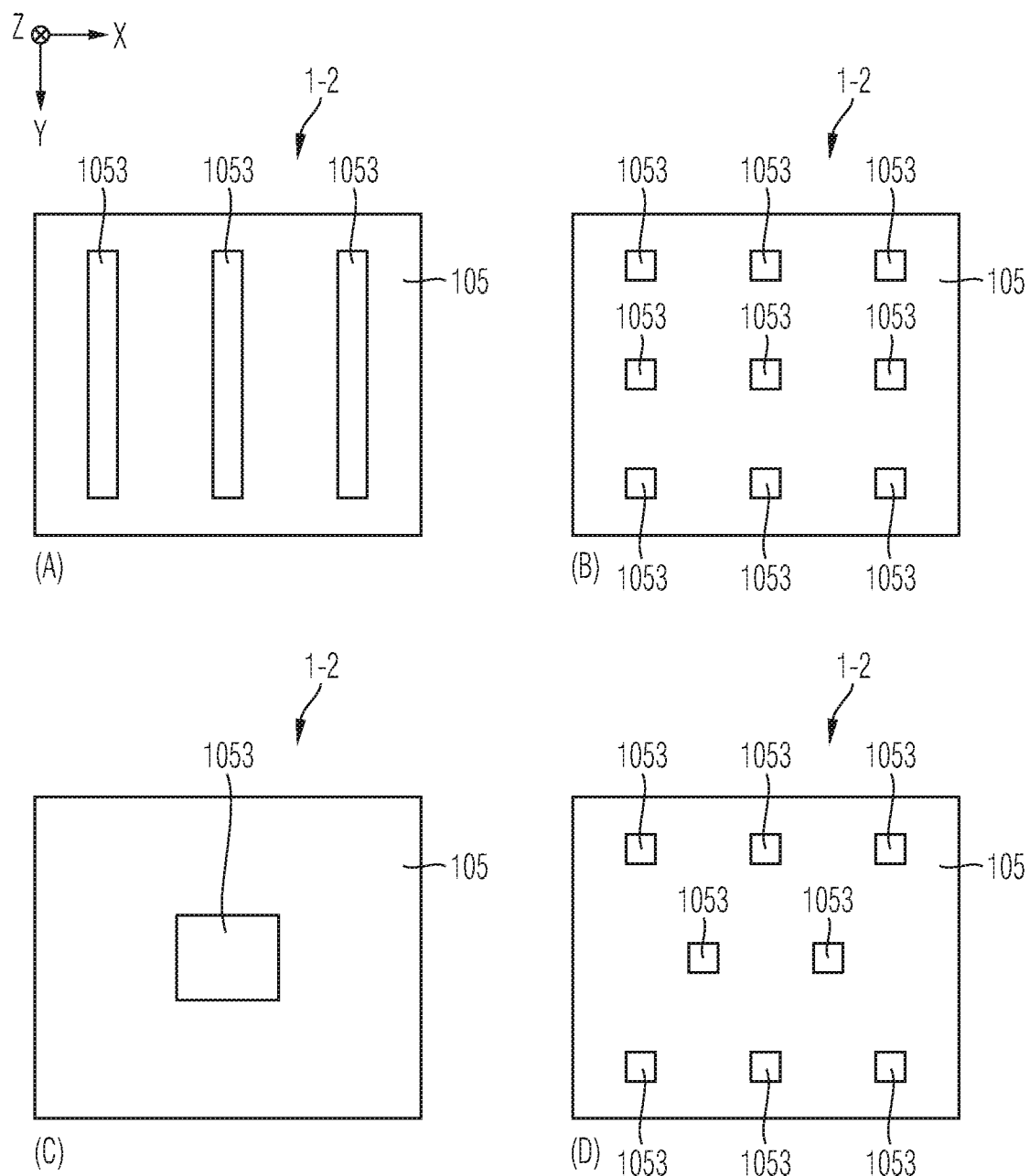

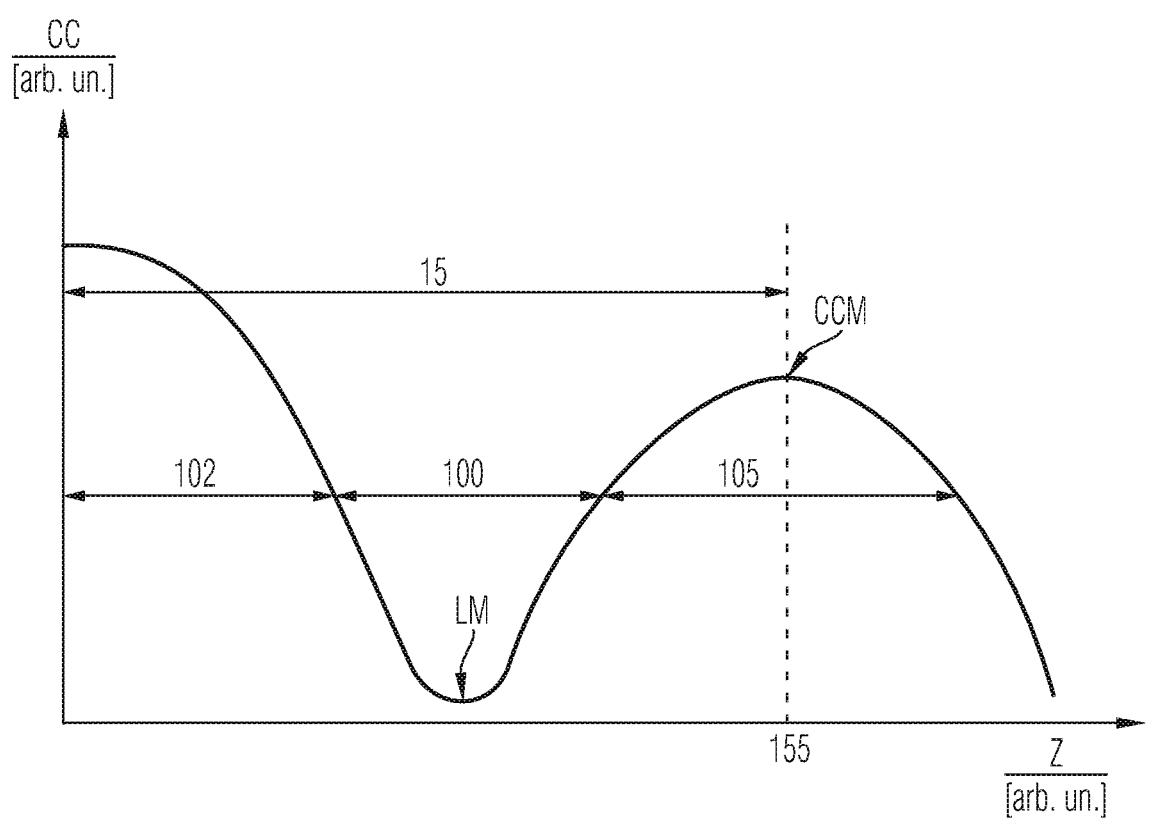

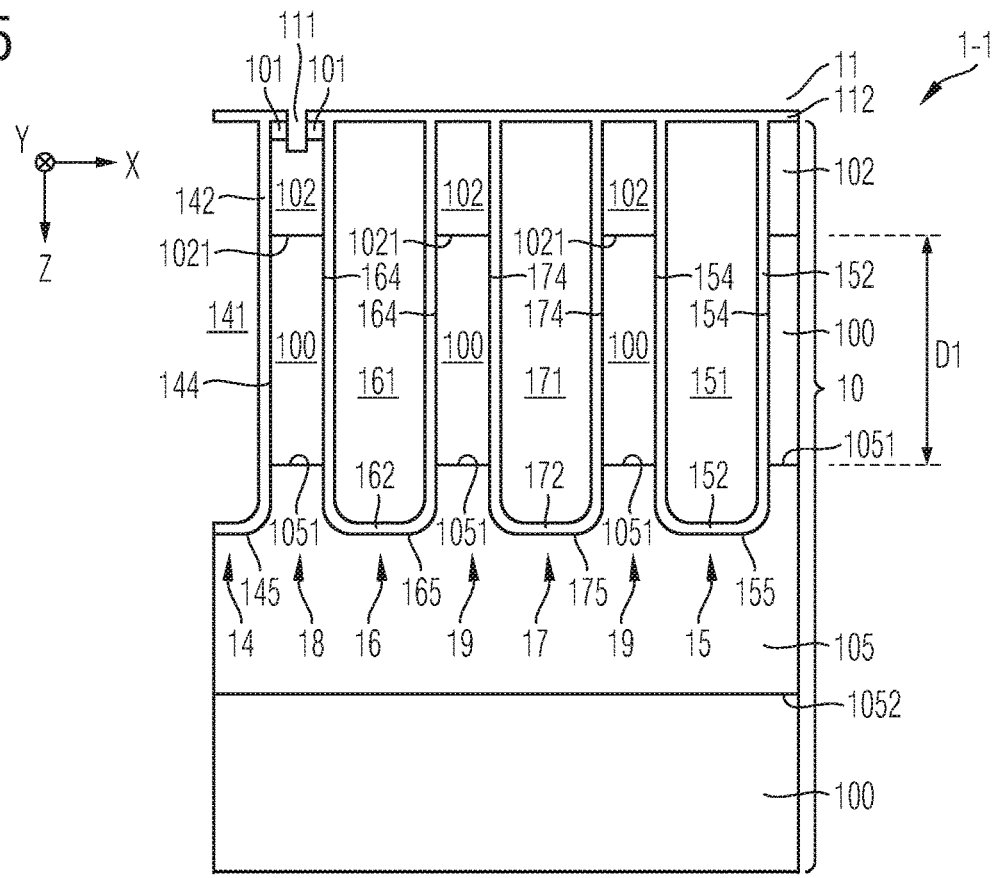
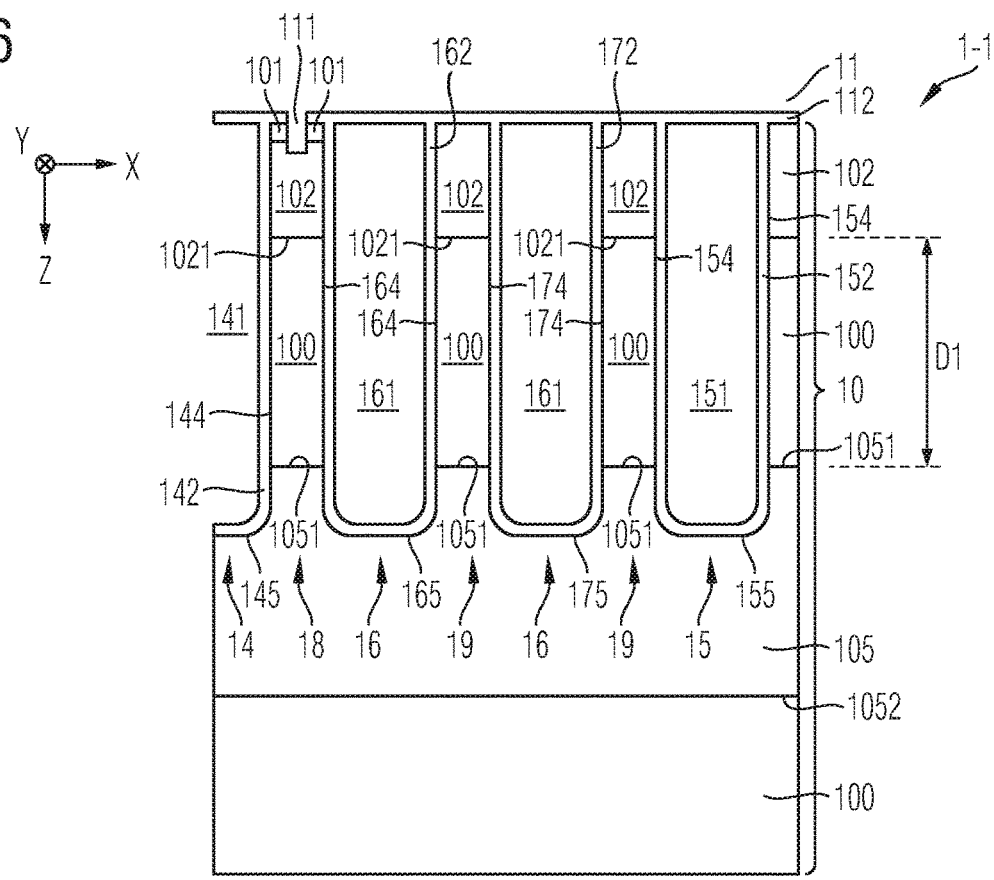

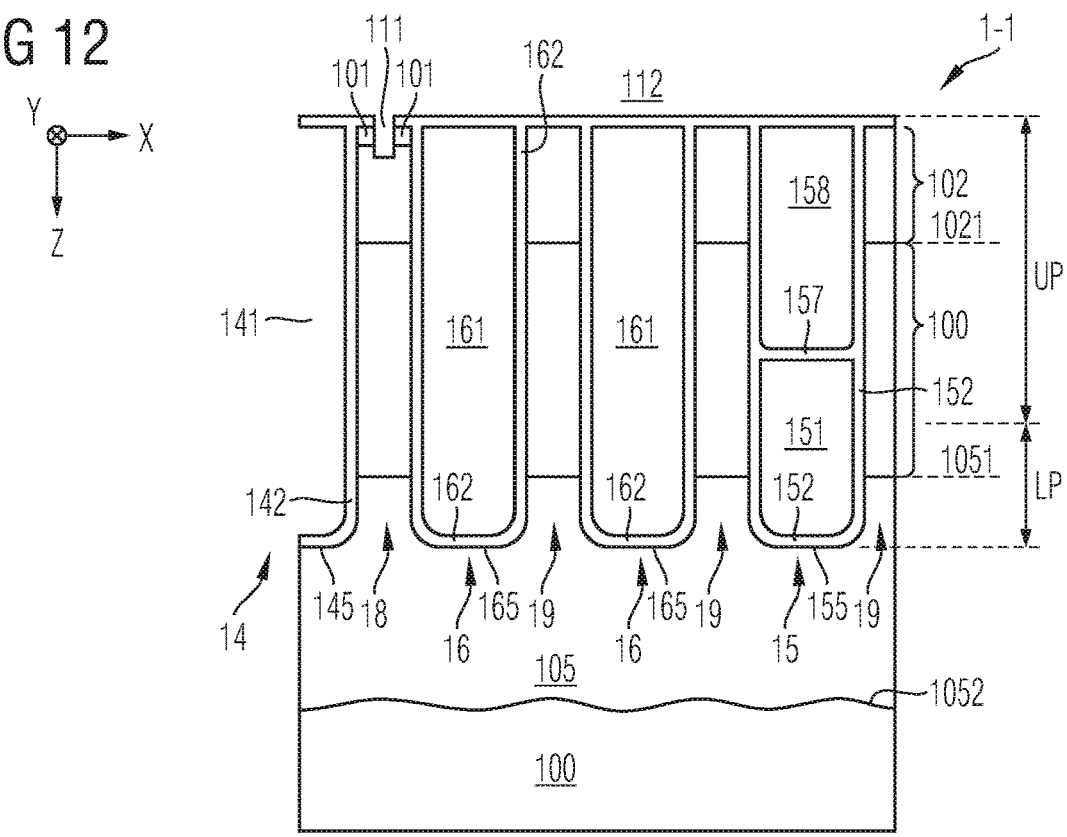
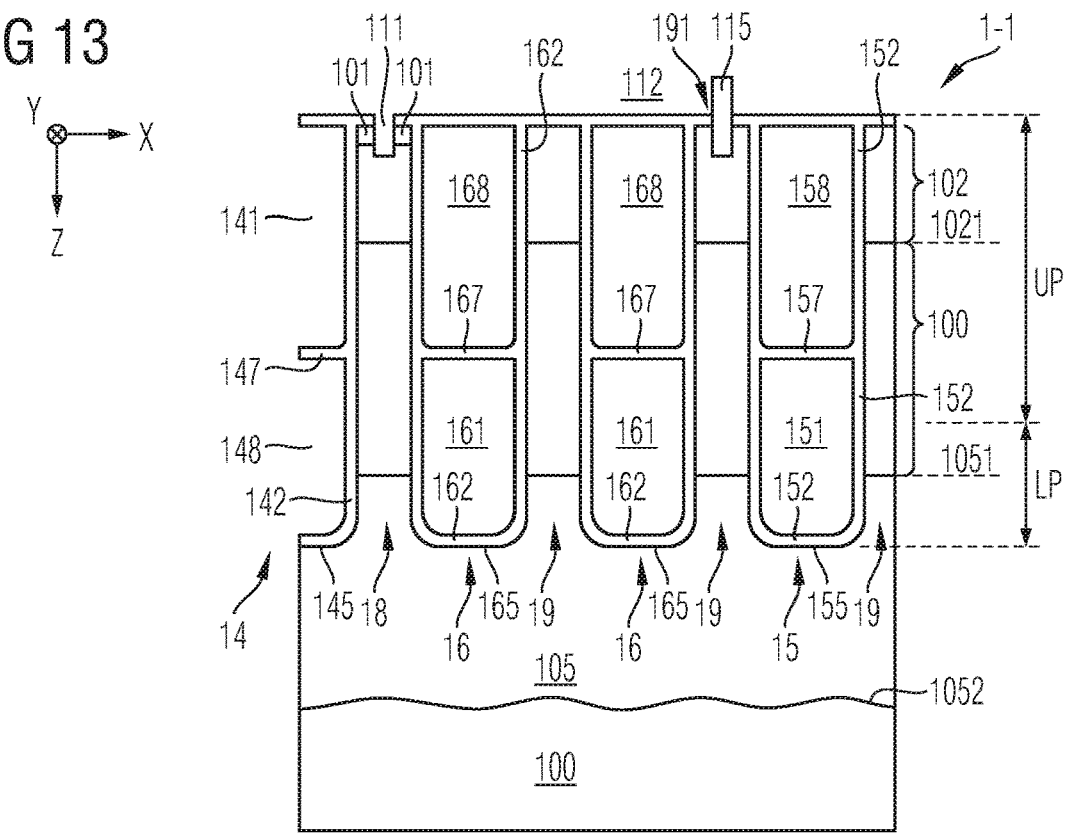

FIG 21
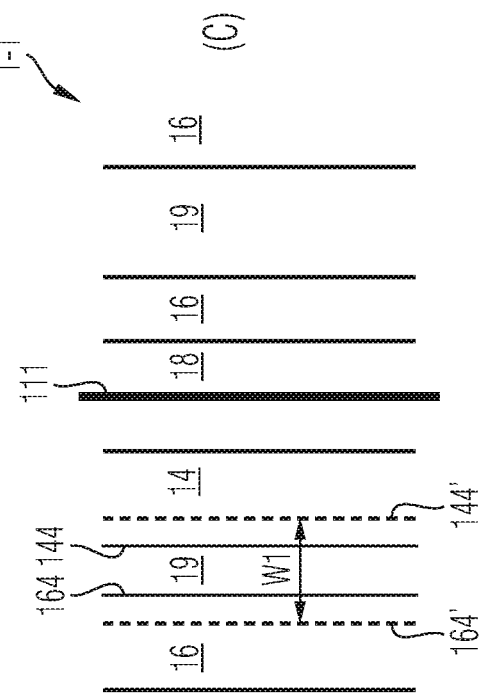
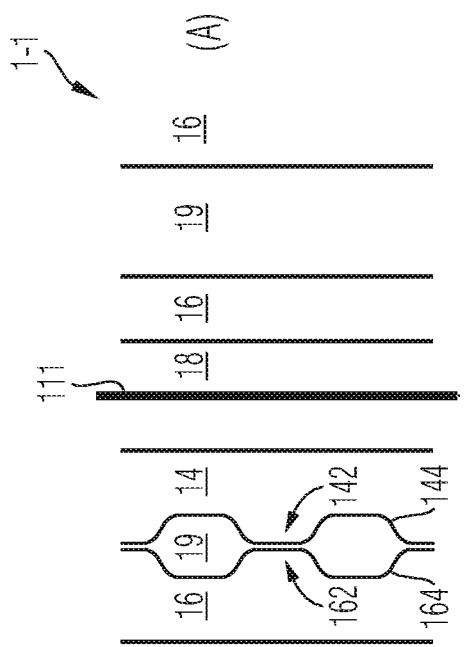
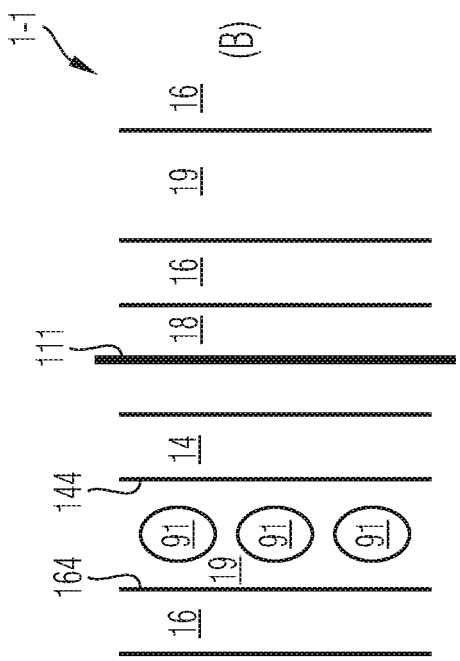

FIG 22
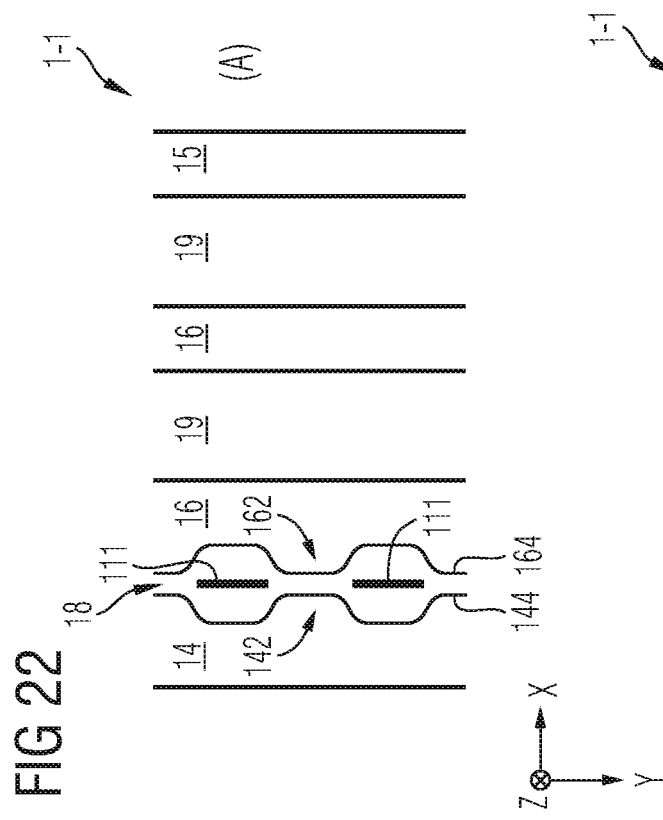
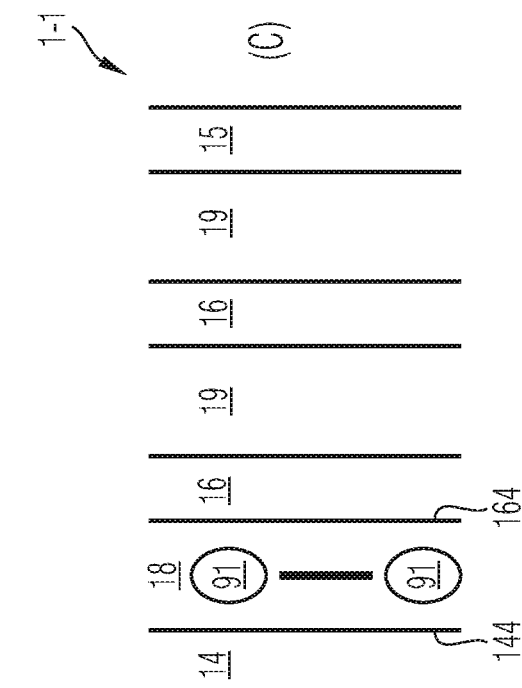
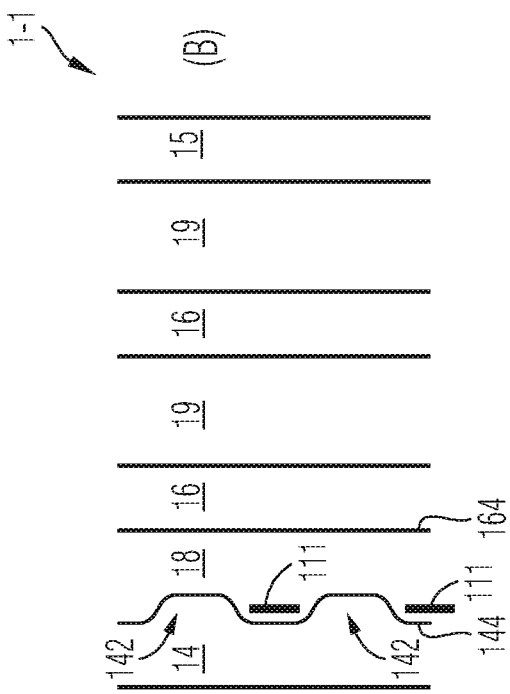

POWER SEMICONDUCTOR DEVICE WITH DV/DT CONTROLLABILITY AND LOW GATE CHARGE

TECHNICAL FIELD

This specification refers to embodiments of an IGBT and to embodiments of a method of processing an IGBT. For example, this specification is directed to embodiments of an IGBT having one or more power unit cells and a barrier region, e.g., for dV/dt controllability, and to corresponding processing methods.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

An IGBT usually comprises a semiconductor body configured to conduct a load current along a load current path between two load terminals of the IGBT. Further, the load current path may be controlled by means of an insulated electrode, sometimes referred to as gate electrode. For example, upon receiving a corresponding control signal from, e.g., a driver unit, the control trench electrode may set the IGBT in one of a conducting state and a blocking state.

In some cases, the gate electrode may be included within a trench of the IGBT, wherein the trench may exhibit, e.g., a stripe configuration or a needle configuration.

Further, such trench occasionally includes more than only one electrode, e.g., two or more electrodes that are arranged separately from each other and sometimes also electrically insulated from each other. For example, a trench may comprise both a gate electrode and a field electrode, wherein the gate electrode can be electrically insulated from each of the load terminals, and wherein the field electrode can be electrically connected to one of the load terminals.

It is usually desirable to keep losses, e.g., switching losses, of the IGBT low. For example, low switching losses may be achieved by ensuring short switching durations, e.g., a short turn-on duration and/or a short turn-off duration. On the other hand, in a given application, there may also be requirements regarding a maximum slope of the voltage (dV/dt) and/or a maximum slope of the load current (dI/dt). Such controllability requirements may need to be fulfilled. At the same time, a high efficiency is usually required as well.

SUMMARY

According to an embodiment, a power semiconductor transistor comprises a semiconductor body coupled to a first load terminal and a second load terminal of the transistor and comprising a drift region of a first conductivity type configured to conduct a load current between said terminals is presented. The power semiconductor transistor further comprises at least one power unit cell including: at least one control trench having a control trench electrode and at least one dummy trench having a dummy trench electrode coupled to the control trench electrode; at least one active mesa comprising a source region of the first conductivity type and electrically connected to the first load terminal and a channel region of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the transistor and to control the load current in the active mesa; a semiconductor barrier region of the second conductivity type implemented in the semiconductor body, the barrier region laterally overlapping with both the active mesa and a bottom of the dummy trench. The at least one control trench has a total control trench volume, the volume of the control trench electrode amounting to less than 80% of the total control trench volume; and/or the at least one dummy trench has a total dummy trench volume, the volume of the dummy trench electrode amounting to less than 80% of the total dummy trench volume.

According to an embodiment, a method of processing a power semiconductor transistor comprising a semiconductor body coupled to a first load terminal and a second load terminal of the transistor and comprising a drift region of a first conductivity type configured to conduct a load current between said terminals is presented. The method comprises forming at least one power unit cell including: at least one control trench having a control trench electrode and at least one dummy trench having a dummy trench electrode coupled to the control trench electrode; at least one active mesa comprising a source region of the first conductivity type and electrically connected to the first load terminal and a channel region of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the transistor and to control the load current in the active mesa; a semiconductor barrier region of the second conductivity type implemented in the semiconductor body, the barrier region laterally overlapping with both the active mesa and a bottom of the dummy trench. The at least one control trench has a total control trench volume, the volume of the control trench electrode amounting to less than 80% of the total control trench volume; and/or the at least one dummy trench has a total dummy trench volume, the volume of the dummy trench electrode amounting to less than 80% of the total dummy trench volume.

For example, both the dummy trench electrode and the control trench electrode are electrically coupled to a control terminal of the IGBT, wherein, e.g., the control terminal may be electrically connected to an output of a driver unit for driving the IGBT. For example, both the dummy trench electrode and the control trench electrode are electrically connected to the control terminal of the IGBT, i.e., by means of a respective low ohmic connection. For example, the electrical potential of the dummy trench electrode can be at least substantially identical to the electrical potential of the control trench electrode. In another embodiment, a first ohmic resistance between the control terminal and the control trench electrode may be different from a second ohmic resistance between the control terminal and the dummy trench electrode. The difference between the first ohmic resistance and the second ohmic resistance may be within the range of 0Ω to 100Ω for example. For example, the second ohmic resistance is greater than the first ohmic resistance.

According to a yet further embodiment, a power semiconductor transistor comprises a semiconductor body coupled to a first load terminal and a second load terminal of the transistor and comprising a drift region of a first conductivity type configured to conduct a load current between said terminals; and at least one power unit cell including at least one first trench having a first trench electrode coupled to a control terminal of the transistor; at least one source trench having a source trench electrode electrically connected to the first load terminal; at least one first mesa spatially confined, along a first lateral direction by means of a sidewall of the first trench and a sidewall of the source trench; a semiconductor barrier region of a second conductivity type implemented in the semiconductor body, the barrier region laterally overlapping with both the first mesa and a bottom of the source trench. Each of the first trench, the source trench and the first mesa exhibit a respective stripe configuration having a greater total extension in a second lateral direction than in the first lateral direction, a nominal mesa width in the first lateral direction being the maximum distance between the first trench sidewall and the source trench sidewall. For at least 10% of the total extension of the first mesa in the second lateral direction, and in a respective vertical cross-section of the first mesa, at least 50% of a nominal cross-sectional area is formed by an insulating material, the nominal cross-sectional area being defined by the nominal mesa width and a depth of the first trench.

According to a yet further embodiment, a further method of processing power semiconductor transistor is presented. The power semiconductor transistor comprises a semiconductor body coupled to a first load terminal and a second load terminal of the transistor and comprising a drift region of a first conductivity type configured to conduct a load current between said terminals. The method comprises forming at least one power unit cell, the at least one power unit cell including at least one first trench having a first trench electrode coupled to a control terminal of the transistor; at least one source trench having a source trench electrode electrically connected to the first load terminal; at least one first mesa spatially confined, along a first lateral direction by means of a sidewall of the first trench and a sidewall of the source trench; a semiconductor barrier region of a second conductivity type implemented in the semiconductor body, the barrier region laterally overlapping with both the first mesa and a bottom of the source trench. Each of the first trench, the source trench and the first mesa exhibit a respective stripe configuration having a greater total extension in a second lateral direction than in the first lateral direction, a nominal mesa width in the first lateral direction being the maximum distance between the first trench sidewall and the source trench sidewall. For at least 10% of the total extension of the first mesa in the second lateral direction, and in a respective vertical cross-section of the first mesa, at least 50% of a nominal cross-sectional area is formed by an insulating material, the nominal cross-sectional area being defined by the nominal mesa width and a depth of the first trench.

For example, the first trench mentioned above is a control trench or a dummy trench. The first mesa can be an active mesa or an inactive mesa.

Those skilled in the art will recognize additional features and advantages upon reading the following detailed description, and upon viewing the accompanying drawings.

BRIEF DESCRIPTION OF THE FIGURES

The parts in the figures are not necessarily to scale, instead emphasis being placed upon illustrating principles of the invention. Moreover, in the figures, like reference numerals designate corresponding parts. In the drawings:

FIG. 3 schematically and exemplarily illustrates sections of horizontal cross-sections of a barrier region in accordance with some embodiments;

FIG. 4 schematically and exemplarily illustrates a course of a dopant concentration in a power semiconductor transistor in accordance with one or more embodiments;

FIG. 5 schematically and exemplarily illustrates a section of a vertical cross-section of a power semiconductor transistor in accordance with one or more embodiments;

FIG. 6 schematically and exemplarily illustrates a section of a vertical cross-section of a power semiconductor transistor in accordance with one or more embodiments;

FIGS. 10-16 each schematically and exemplarily illustrate a section of a vertical cross-section of a power semiconductor transistor in accordance with some embodiments;

FIGS. 20-22 each schematically and exemplarily illustrate a section of a horizontal projection of a power semiconductor transistor in accordance with some embodiments.

DETAILED DESCRIPTION

Figure 1:
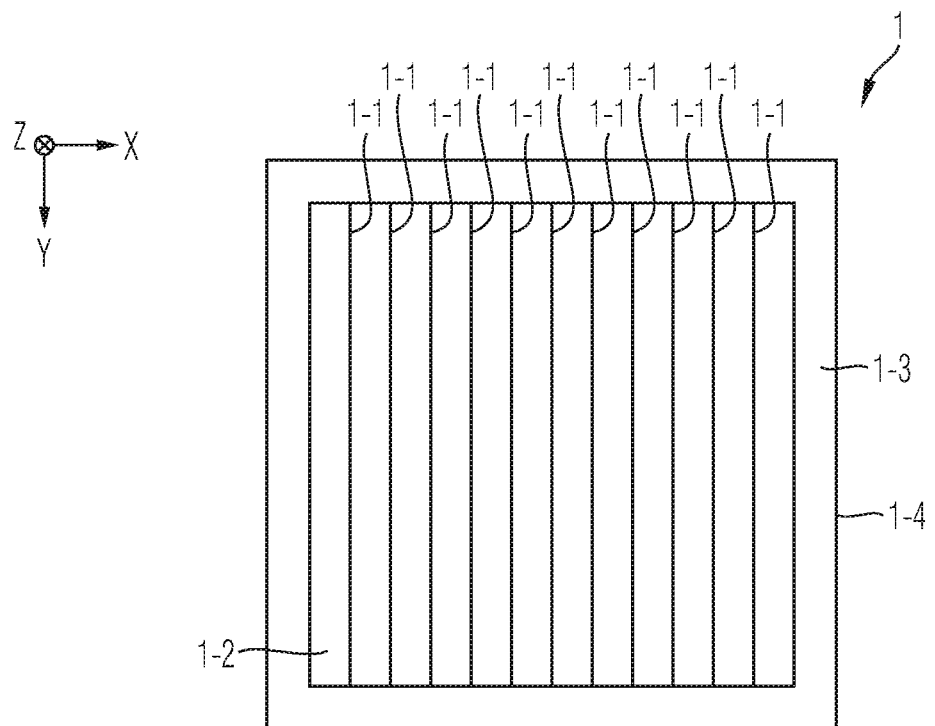
FIG. 1 schematically and exemplarily illustrates a section of a horizontal projection of a power semiconductor transistor in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y; herein, the extension direction Z is hence also referred to as vertical direction Z.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor transistor, such as an IGBT, e.g., exhibiting a stripe cell or cellular cell configuration, e.g., an IGBT that may be used within a power converter or a power supply. Thus, in an embodiment, such IGBT can be configured to carry a load current that is to be fed to a load and/or, respectively, that is provided by a power source. For example, the IGBT may comprise one or more active power semiconductor cells, such as a monolithically integrated IGBT cell, and/or a monolithically integrated RC-IGBT cell. Such transistor cells may be integrated in a power semiconductor module. A plurality of such cells may constitute a cell field that is arranged with an active region of the IGBT.

The term "power semiconductor transistor" as used in this specification intends to describe a semiconductor device on a single chip with high voltage blocking and/or high current-carrying capabilities. In other words, such power semiconductor transistor is intended for high current, typically in the Ampere range, e.g., up to several ten or hundred Ampere, and/or high voltages, typically above 15 V, more typically 100 V and above, e.g., up to at least 400 V.

For example, the power semiconductor transistor described below may be a semiconductor transistor exhibiting a stripe cell configuration or a cellular cell configuration and can be configured to be employed as a power component in a low-, medium- and/or high voltage application.

For example, the term "power semiconductor transistor" as used in this specification is not directed to logic semiconductor devices that are used for, e.g., storing data, computing data and/or other types of semiconductor-based data processing.

In the following, embodiments will be presented that are related to power semiconductor transistors having an IGBT configuration. However, it will be understood to the skilled person that the description may equally apply to a power semiconductor transistor having a MOSFET configuration. Hence, the power semiconductor transistors described below may be designed as MOSFETs, by correspondingly designing the doped contact region 108 mentioned below (e.g., by providing an n-type source instead of a p-type emitter). The instant specification and claims use the term "emitter" and "source" interchangeably when referring to a first load terminal of an IGBT and use the term "drain" and "collector" interchangeably when referring to a second load terminal of an IGBT which has an opposite conductivity type as the first load terminal. Correspondingly, the embodiments described herein may encompass a MOSFET configuration wherein the first and second load terminals of the MOSFET, i.e., the "source" and "drain" terminals, have the same conductivity type.

Figure 2:
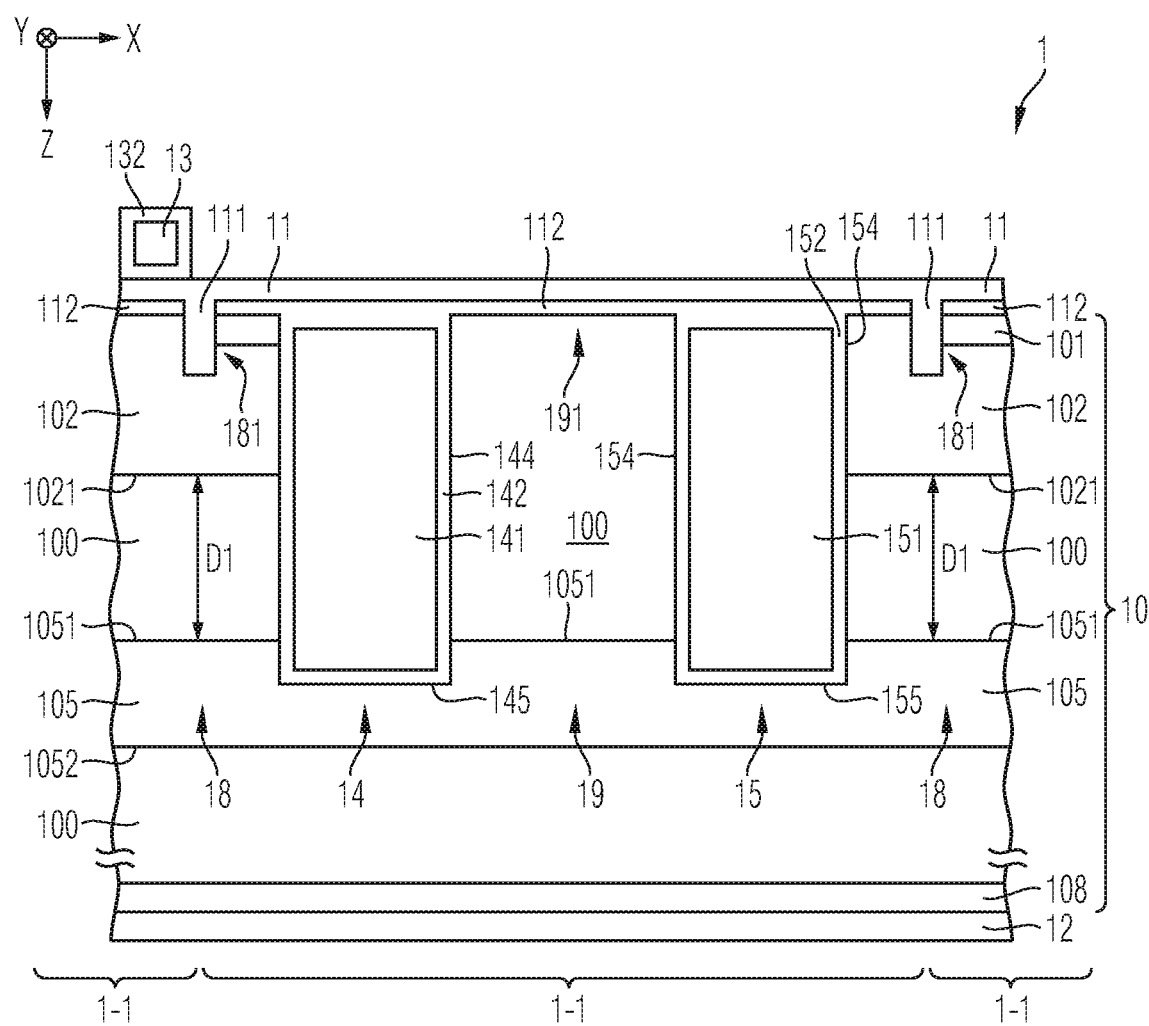
FIG. 2 schematically and exemplarily illustrates a section of a vertical cross-section of a power semiconductor transistor in accordance with one or more embodiments.

FIG. 1 schematically and exemplarily illustrates a section of a horizontal projection of an IGBT 1 in accordance with one or more embodiments. FIG. 2 schematically and exemplarily illustrates a section of a vertical cross-section of an embodiment of the IGBT 1 in accordance with one or more embodiments. In the following, it will be referred to each of FIG. 1 and FIG. 2.

For example, the IGBT 1 comprises a semiconductor body 10 that is coupled to a first load terminal 11 and a second load terminal 12. For example, the first load terminal 11 is an emitter terminal, whereas the second load terminal 12 can be a collector terminal.

The semiconductor body 10 may comprise a drift region 100 with dopants of the first conductivity type. Hence, the drift region 100 is of the first conductivity type. For example, the extension of the drift region 100 along the extension direction Z and its dopant concentration are chosen in dependence of the blocking voltage rating for which the IGBT 1 shall be designed, as it is known to the skilled person.

Further, the first load terminal 11 may be arranged on the frontside of the IGBT 1 and may include a frontside metallization. The second load terminal 12 may be arranged, opposite to the frontside, e.g., on a backside of the IGBT 1 and may include, for example, a backside metallization. Accordingly, the IGBT 1 may exhibit a vertical configuration. In another embodiment, both the first load terminal 11 and the second load terminal 12 may be arranged on a common side, e.g., both on the frontside, of the IGBT 1.

The IGBT 1 may further include an active region 1-2, an inactive termination structure 1-3 and a chip edge 1-4. The chip edge 1-4 may laterally terminate the semiconductor body 10, e.g., the chip edge 1-4 may have become into being by means of wafer dicing, for example, and may extend along the extension direction Z. The inactive termination structure 1-3 may be arranged between the active region 1-2 and the chip edge 1-4, as illustrated in FIG. 1.

In the present specification, the terms "active region" and "termination structure" are employed in a regular manner, i.e., the active region 1-2 and the termination structure 1-3 may be configured to provide for the principle technical functionalities typically associated therewith. For example, the active region 1-2 of the IGBT 1 is configured to conduct the load current between the terminals 11, 12, whereas the termination structure 1-3 does not conduct the load current, but rather fulfills functions regarding the course of the electric field, ensuring the blocking capability, safely terminating the active region 1-2 and so forth, in accordance with an embodiment. For example, the termination structure 1-3 may entirely surround the active region 1-2, as illustrated in FIG. 1.

The active region 1-2 may comprise at least one power unit cell 1-1. In an embodiment, there are included a plurality of such power unit cells 1-1 within the active region 1-2. The number of power unit cells 1-1 may be greater than 100, than 1000, or even greater than 10,000.

Each power unit cell 1-1 may exhibit a stripe configuration as schematically illustrated in FIG. 1, wherein the total lateral extension in one lateral direction, e.g., along the second lateral direction Y, of each power unit cell 1-1 and at least one or more of its components may substantially correspond to the total extension of the active region 1-2 along this lateral direction. However, this does not exclude that one or more components of the respective power unit cell 1-1 is structured along the second lateral direction Y; e.g., in an embodiment, the source region mentioned below (reference numeral 101) may be structured along the second lateral direction Y within the respective power unit cell 1-1. For example, the source region is only locally provided, with intermission regions (e.g., of the second conductivity type) separating adjacent local source regions along the second lateral direction Y (cf. reference numeral 1015 in FIG. 9).

In another embodiment, each power unit cell 1-1 may exhibit a cellular configuration, wherein the lateral extensions of each power unit cell 1-1 may be substantially smaller than the total lateral extensions of the active region 1-2.

In an embodiment, each of the plurality of power unit cells 1-1 that are included in the active region 1-2 exhibit the same set-up. An example of such set-up will now be described with respect to FIG. 2. However, this does not exclude that the active region 1-2 further comprises other cells of a different type, e.g., auxiliary cells or the like (not illustrated).

Each power unit cell 1-1 may extend at least partially into the semiconductor body 10 and may comprise at least a section of the drift region 100. Further, each power unit cell 1-1 may be electrically connected with the first load terminal 11. Each power unit cell 1-1 may be configured to conduct a part of the load current between said terminals 11 and 12, and to block a blocking voltage applied between said terminals 11 and 12.

For controlling the IGBT 1, each power unit cell 1-1 may be operatively coupled to or, respectively, comprise a control trench electrode 141 configured to selectively set the respective power unit cell 1-1 into one of the conducting state and the blocking state.

For example, referring to the example illustrated in FIG. 2, a source region 101 may be electrically connected with the first load terminal 11 and may comprise dopants of the first conductivity type, e.g., at a significantly greater dopant concentration as the drift region 100. Hence, the source region 101 is of the first conductivity type.

Further, a channel region 102 may be provided that comprises dopants of the second conductivity type and that separates the source region 101 and the drift region 100 from each other, e.g., the channel region 102 isolates the source region 101 from the drift region 100. The channel region 102 can hence be of the second conductivity type.

For example, the at least one power unit cell 1-1 includes at least one control trench 14 having the control trench electrode 141.

Further, in an embodiment, the at least one power unit cell 1-1 may include at least one dummy trench 15 having a dummy trench electrode 151. The dummy trench electrode 151 can be coupled to the control trench electrode 141.

For example, both the dummy trench electrode 151 and the control trench electrode 141 are electrically coupled to a control terminal 13 of the IGBT 1, wherein, e.g., the control terminal 13 may be electrically connected to an output of a driver unit (not illustrated) for driving the IGBT 1. For example, both the dummy trench electrode 151 and the control trench electrode 141 are electrically connected to the control terminal 13 of the IGBT 1, i.e., by means of a respective low ohmic connection (not illustrated). For example, the electrical potential of the dummy trench electrode 151 can be at least substantially identical to the electrical potential of the control trench electrode 141. In another embodiment, a first ohmic resistance between the control terminal 13 and the control trench electrode 141 may be different from a second ohmic resistance between the control terminal 13 and the dummy trench electrode 151. The difference between the first ohmic resistance and the second ohmic resistance may be within the range of 0Ω to 100Ω for example. For example, the second ohmic resistance is greater than the first ohmic resistance.

For example, both the control trench 14 and the dummy trench 15 may extend into the semiconductor body 10 along the extension direction Z and may both include an insulator 142, 152 that insulates the respective trench electrode 141, 151 from the semiconductor body 10.

The trench electrodes 141, 151 of the at least one control trench 14 and of the at least one dummy trench 15 may both be electrically coupled (e.g., electrically connected) to the control terminal 13 of the IGBT 1, in accordance with an embodiment.

For example, the control terminal 13 is a gate terminal. Further, the control terminal 13 may be electrically connected to the control trench electrode 141 and electrically insulated from the first load terminal 11, the second load terminal 12 and the semiconductor body 10, e.g., by means of at least an insulation structure 132.

In an embodiment, the IGBT 1 may be controlled by applying a voltage between the first load terminal 11 and the control terminal 13, e.g., to selectively set the IGBT 1 into one of the conducting state and the blocking state.

For example, the IGBT 1 is configured to be controlled based on a gate-emitter-voltage $V_{GE}$, e.g., in a principle manner of controlling an IGBT known to the skilled person.

In an embodiment, the dummy trench electrode 151 may also be electrically connected to the control terminal 13 and thus receive the same control signal as the control trench electrode 141.

In another embodiment, the dummy trench electrode 151 may be electrically coupled to the control terminal 13 by means of a resistor having a resistance within the range of 1e-3 Ohm to 1 Ohm, within the range of 1 Ohm to 10 Ohm, or within the range of 10 Ohm to 100 Ohm.

In another embodiment, the dummy trench electrode 151 is electrically connected to a second control terminal (not illustrated) and thus receives a control signal different from the control signal provided to the control trench electrode 141.

Further, the at least one power unit cell 1-1 of the IGBT 1 may have at least one active mesa 18 electrically connected to the first load terminal 11, the active mesa 18 comprising the source region 101, the channel region 102 and a part of the drift region 100, wherein, in the active mesa 18, respective sections of these regions 101, 102, 100 can be arranged adjacent to a sidewall 144 of the control trench 14, as exemplarily illustrated in FIG. 2. For example, both the source region 101 and the channel region 102 are electrically connected to the first load terminal 11, e.g., by means of a contact plug 111.

Further, the control trench electrode 141 (herein also referred to as control trench electrode 141) can be configured to receive a control signal from the control terminal 13 and to control the load current in the active mesa 18, e.g., by inducing an inversion channel in the channel region 102 to set the IGBT 1 into a conducting state. Thus, a transition 181 between the first load terminal 11 and the active mesa 18 may provide for an interface for the load current to pass from the first load terminal 11 into the semiconductor body 10 and/or vice versa.

For example, the control trench electrodes 141 of all power unit cells 1-1 that are included in the active region 1-2 may be electrically connected to the control terminal 13.

In addition to the active mesa 18 included in the at least one power unit cell 1-1, the at least one power unit cell 1-1 of the IGBT 1 can have at least one inactive mesa 19, e.g. arranged adjacent to the at least one dummy trench 15, wherein a transition 191 between the first load terminal 11 and the inactive mesa 19 provides an electrical insulation at least for charge carriers of the first conductivity type.

In an embodiment, the power unit cell 1-1 may be configured to prevent the load current from crossing said transition 191 between the inactive mesa 19 and the first load terminal 11. For example, the inactive mesa 19 does not allow for inducing an inversion channel. In contrast to the active mesa 18, the inactive mesa 19 does not conduct the load current during the conducting state of the IGBT 1, in accordance with an embodiment. For example, the inactive mesa 19 can be considered as a decommissioned mesa that is not used for the purpose of carrying the load current. To this end, the inactive mesa 19 must not necessarily be made exclusively of a conducting semiconductor material, but may, e.g., also included oxidized portions or portion with another insulating material.

With respect to FIG. 2 and FIG. 5, two variants of the active mesa 18 shall be elucidated. For example, referring to FIG. 5, in a first variant, the source region 101 can be arranged on both sides of the contact plug 111, e.g., both sections of the source region 101 contact, with their inner sides, the contact plug 111, and, with their outer sides, the trench sidewalls (e.g., 144 and 154 (or 164)) that spatially confine the active mesa 18. In this first variant, the active mesa 18 can be regarded as being active along its entire extension in the first lateral direction X, i.e., along its entire width. Now referring to FIG. 2 again, in a second variant, the active mesa 18 is not active along its entire width, but divided into an active portion and an inactive portion, wherein each of said portions may have the same share of the total mesa volume. For example, the source region 101 is only present between the contact plug 111 and the sidewall 144 of the control trench 14. In the portion where the source region 101 is present, the active mesa 18 can be active, e.g., conduct a part of the load current. On the other side of the contact plug 111, e.g., that faces to another type trench than the control trench, e.g., a dummy trench or a source trench (mentioned further below), the active mesa 18 may have its inactive portion; there, due to lack of the source region 101, an inversion channel cannot be induced and hence no part of the load current can be conducted.

Herein, the description of the inactive mesa 19 can analogously apply to the inactive portion of the active mesa 18.

In a first embodiment of the inactive mesa 19, the inactive mesa 19 is not electrically connected to the first load terminal 11, but electrically insulated therefrom, e.g., by means of an insulation layer 112. In this embodiment, the transition 191 between the first load terminal 11 and the inactive mesa 19 provides an electrical insulation not only for charge carriers of the first conductivity type, but also for charge carriers of the second conductivity type. To this end, in a variant the inactive mesa 19 comprises neither section of the source region 101 nor a section of the channel region 102 nor is the inactive mesa 19 contacted by means of a contact plug (cf. reference numeral 111), as illustrated in FIG. 2. In another variant, the inactive mesa 19 may be configured in a similar manner as the active mesa 18, e.g., by also comprising a section of the source region 101 and/or a section of the channel region 102, the difference to the active mesa 18 including that neither the section of the source region 101 (if present) nor the section of the channel region 102 of the inactive mesa 19 is electrically connected to the first load terminal 11. In accordance with the first embodiment of the inactive mesa 19, no current at all crosses said transition 191.

In a second embodiment of the inactive mesa 19, the inactive mesa 19 may be electrically connected to the first load terminal 11, wherein the transition 191 between the first load terminal 11 and the inactive mesa 19 provides an electrical insulation only for charge carriers of the first conductivity type, but not for charge carrier of the second conductivity type. In other words, in this second embodiment, the inactive mesa 19 may be configured at allow a current of charge carriers of the second conductivity type, e.g., a hole current, to pass said transition 191. For example, depending on the electrical potential of the trench electrode of the trench adjacent to the inactive mesa 19, e.g., the dummy trench electrode 151, such hole current may only temporarily come into being, e.g., shortly before carrying out a turn-off operation, e.g., to reduce the total charge carrier concentration present in the semiconductor body 10. As stated above, in this second embodiment, the inactive mesa 19 may be electrically connected to the first load terminal 11. For example, a doped contact region (not illustrated) with dopants of the second conductivity type (that is different from the barrier region 105 mentioned below) of the inactive mesa 19 may be electrically connected to the first load terminal 11, e.g., by means of a contact plug similar or identical to the type of contact plug 111 that may be used to contact the active mesa 18. The doped contact region (not illustrated) with dopants of the second conductivity type and may isolate the section of the drift region 100 that is present within the inactive mesa 19 from the first load terminal 11. For example, in accordance with the second embodiment of the inactive mesa 19, within the inactive mesa 19, there is no region doped with dopants of the first conductivity type that is electrically connected to the first load terminal 11.

The above illustrated first embodiment and second embodiment of the inactive mesa 19 (or, respectively, the inactive portion of the active mesa 18) may allow for providing the configuration of the power unit cell 1-1 to prevent the load current from crossing said transition 191 between the inactive mesa 19 and the first load terminal 11.

The inactive mesa 19 may be laterally confined by the control trench 14 and a further trench, e.g., by the dummy trench 15 and another trench type, which will be elucidated further below. Further optional aspects of the inactive mesa 19 will be described below. For example, even though the dummy trench electrode 151 may be electrically connected to the control terminal 13 in an example, the dummy trench electrode 151 is not configured to control the load current in the inactive mesa 19, since the inactive mesa 19 (or, respectively, the inactive portion of the active mesa 18) does not allow for inducing an inversion channel within the inactive mesa 19, in accordance with an embodiment. Hence, in an embodiment, the configuration of the dummy trench electrode 151 to not control the load current can be achieved by positioning the dummy trench 15 between and adjacent to two inactive mesas 19, or, respectively, between and adjacent to inactive portions of two active mesas 18 or, respectively, between and adjacent to an inactive mesa 19 on one side and adjacent to an inactive mesa portion of an active mesa 18 on the other side.

The at least one power unit cell 1-1 of the IGBT 1 can have a semiconductor barrier region 105 (in the following referred to as barrier region) implemented in the semiconductor body 10 and comprising dopants of the second conductivity type. Hence, the barrier region 105 can be of the second conductivity type.

In an embodiment, the barrier region 105 can laterally overlap with both the active mesa 18 and a bottom 155 of the dummy trench 15, e.g., as illustrated in FIG. 2. As used herein, the term "laterally overlap, "laterally overlapping" and the like intends to describe an orientation wherein the reference plane defining the area of overlap, i.e., the area wherein one element is disposed over another element, extends in the lateral direction of the semiconductor substrate. For instance, in FIG. 2, the active mesa 18 and a bottom 155 of the dummy trench 15 are disposed over the barrier region 105 relative to a reference plane that extends in the X direction of the substrate. By contrast, the term "vertically overlap, "vertically overlapping" and the like intends to describe an orientation wherein the reference plane defining the area of overlap, i.e., the area wherein one element is disposed over another element, extends in a vertical direction of the semiconductor substrate. For instance, in FIG. 11, the oxidized region 195 vertically overlaps, with the channel region 102 relative to a reference plane that extends in the Z direction of the substrate. As also clearly illustrated in FIG. 8, the barrier region 105 may overlap with at least 50% a width (e.g., along the first lateral direction X) of the active mesa 18. The width may be present at the channel region 102. For example, the width is the maximum width of the active mesa 18.

In an embodiment, the barrier region 105 may overlap with more than 50% of the width of the active mesa 18, e.g., with the entire first width of the active mesa 18 and, optionally, also with entire width of the dummy trench 15.

At this point, it is emphasized that the barrier region 105 may be electrically floating and that said lateral overlap may also be formed in case the at least one power unit cell 1-1 does not comprise the inactive mesa 19. Further, as illustrated, the barrier region 105 may also laterally overlap with the control trench 14, e.g., with the bottom 145 of the control trench 14, e.g., with the entire bottom 145 of the control trench 14.

Irrespective of said lateral overlap, in an embodiment, the barrier region 105 is electrically floating. For example, the barrier region 105 is not electrically connected with a defined electrical potential, e.g., neither to the first load terminal 11, nor to the second load terminal 12, nor to the control terminal 13. In an embodiment, the electrically floating barrier region 105 can be connected, by means of a connection having a high ohmic resistance, to a defined electrical potential (e.g., to an electrical potential of a contact or to an electrical potential of another semiconductor region). For example, by means of said high ohmic connection, during a switching operation of the IGBT 1, the electrical potential of the barrier region 105 is temporarily decoupled from the defined electrical potential. Said decoupling may occur on a time scale of said switching operation, e.g., for at least 10 ns, or at least 100 ns, or at least 10 µs. For example, the resistance of said high ohmic connection amounts to more than 1e2, or to more than 1e6. In an embodiment, an ohmic resistance, e.g. measured during a standstill situation, between the first load terminal 11 and the barrier region 105 amounts to more than 1e2, or to more than 1e6. For example, for ensuring that the barrier region 105 is electrically floating, in an embodiment, the barrier region 105 does not extend into the inactive termination structure 1-3; e.g., the barrier region 105 can exclusively be arranged within the active region 1-2.

In an embodiment, the barrier region 105 is configured to provide for an electrically conductive path between a section of the active mesa 18 and the bottom 155 of the dummy trench 15. Thus, the barrier region 105 may be configured to guide the electrical potential of the section of the active mesa 18 to the bottom 155 of the dummy trench 15.

Further, the barrier region 105 may connect two or more dummy trench bottoms 155 with each other. For example, the barrier region 105 connects dummy trench bottoms of adjacent power unit cells 1-1 with each other.

The barrier region 105 may exhibit a resistivity of more than 10 Ωcm and of less than 1000 Ωcm, e.g., of more than 100 Ωcm and of less than 500 Ωcm, in accordance with an embodiment.

The barrier region 105 may include at least one of boron (B), aluminum (Al), difluoroboryl ($BF_2$), boron trifluoride ($BF_3$), or a combination thereof. A respective one of these exemplary materials may serve as the dopant material, in accordance with an embodiment. Further, a respective one of these exemplary materials can be implanted into the semiconductor body 10 to form the barrier region 105.

In an embodiment, forming the barrier region 105 is carried out in accordance with a self-aligned process. For example, recesses may be etched into the semiconductor body 10 for forming the trenches 14, 15 (and, optionally, also trenches 16 and/or 17). The dopant for forming the barrier region 105 may be implanted into the etched recesses such that it penetrates, e.g., exclusively, the recess bottoms (and not the recess sidewalls). In an embodiment, the channel region 102 and barrier region 105 are formed by means of the one or more joint implantation processing steps.

For example, the barrier region 105 exhibits a dopant concentration greater than 1e14 $cm^{-3}$ and smaller than 2e18 $cm^{-3}$. Said dopant concentration, e.g., amounting to approximately 1e16 $cm^{-3}$, may be present with an extension along the extension direction Z of at least 0.5 µm, or of at least 1 µm.

Further, the barrier region 105 may exhibit a maximum dopant concentration in a region where the bottom 155 of the dummy trench 15 extends into the barrier region 105. According to the above described exemplary processing step, the same maximum dopant concentration can be present where other trench bottoms (cf. reference numerals 145, 165, 175) extend into the barrier region 105.

An exemplary course of the dopant concentration of dopants of the second conductivity type along the extension direction Z is illustrated in FIG. 4. Such course may be present in both the active mesa 18 and the inactive mesa 19. Accordingly, in an upper section of the respective mesa 18/19, e.g., in proximity to the first load terminal 11, the dopant concentration CC may be comparatively high to provide for the channel region 102 (that is, e.g., not electrically connected to the first load terminal in case of the inactive mesa 19). The dopant concentration CC then decreases rapidly in a section of the mesa where the drift region 100 is present. As it is known to the skilled person, the transition between the channel region 102 and the drift region 100 may form a first pn-junction 1021 within the respective mesa. In case the inactive mesa 19 does not comprise a section of the channel region 102, the value of the dopant concentration CC between the beginning at the first load terminal 11 and the beginning of the barrier region 105 would accordingly be at the value corresponding to the local minimum LM illustrated in FIG. 2. Then, e.g., before the respective trench bottom 145/155, the dopant concentration CC increases (again) to form the barrier region 105. As illustrated, the barrier region 105 may exhibit its dopant concentration maximum CCM at the depth level being substantially identical to the level where the respective trench terminates, e.g., at the level of the bottom 155 of the dummy trench 15.

Regarding exemplary spatial dimensions of the barrier region 105, the barrier region 105 may extend into the active mesa 18 and from there below the bottom 145 of the control trench 14 and across the inactive mesa 19 to interface with the bottom 155 of the dummy trench 15. In an embodiment, both the bottom 155 of the dummy trench 15 and the bottom 145 of the control trench 14 may extend into the barrier region 105.

The barrier region 105 may be separated from the channel region 102 by means of at least a part of the drift region 100. For example, the barrier region 105 may form a "carpet" arranged in parallel to both the first load terminal 11 and the second load terminal 12 and separated from each of these terminals 11, 12 by means of at least the drift region 100. Such carpet like configuration of the barrier region 105 may be positioned within the semiconductor body 10 such that the trench bottoms 145 and 155 may plunge into the barrier region 105.

For example, the barrier region 105 exhibits a thickness along the extension direction Z within the range of 0.1 µm to 0.5 µm, within the range of 0.5 µm to 1 µm, or within the range of 1 µm to 5 µm.

Subsequent to the barrier region 105, the drift region 100 may extend along the extension direction Z until it interfaces with a doped contact region 108 (cf. FIG. 2) that is arranged in electrical contact with the second load terminal 12. The section of the drift region 100 arranged between the barrier region 105 and the doped contact region 108 may form the major part of the drift region 100.

The doped contact region 108 may be formed in accordance with the configuration of the IGBT 1; e.g., the doped contact region 108 can comprise an emitter region with dopants of the second conductivity type. For forming an RC-IGBT, the doped contact region 108 may comprise an emitter region with dopants of the second conductivity type and intersected by small sections with dopants of the first conductivity type (not illustrated) that are also electrically connected to the second load terminal 12 and which are commonly referred to as "n-shorts".

In an embodiment of the IGBT 1, the doped contact region 108 comprises a p-type emitter, and the active mesa 18 may entirely laterally overlap with the p-type emitter.

Further, the doped contact region 108 may comprise a field stop region of the first conductivity type, e.g., between the p-type emitter region and the drift region 100. In the context of IGBTs, the concept of a field stop region is generally known to the skilled person and, hence, it is refrained from further elucidating this optional aspect.

Returning to the barrier region 105, the barrier region 105 may form both an upper pn-junction 1051 and a lower pn-junction 1052 with the drift region 100. For example, the lower pn-junction 1052 is arranged lower than both the bottom 155 of the dummy trench 15 and the bottom 145 of the control trench 14. For example, the upper pn-junction 1051 is arranged within both the active mesa 18 and the inactive mesa 19.

The distance D1 between the first pn-junction 1021 and the upper pn-injunction 1051 along the extension direction Z may amount to at 150 nm, or to at least 0.5 µm. Thus, the two pn-junctions 1021 and 1051 are not identical to each other, but separated from each other by means of the drift region 100, in accordance with an embodiment. In other words, the barrier region 105 may be separated from the channel region 102 by means of at least a part of the drift region 100 and, the total vertical extension of said part of the drift region 100 along the extension direction Z may amount to the distance D1 of at least 150 nm.

In a (non-illustrated embodiment), the upper pn-junction 1051 may even be arranged lower than both the bottom 155 of the dummy trench 15 and the bottom 145 of the control trench 14 (wherein this example is not illustrated). In that case, a distance along the extension direction Z between the bottom 155 of the dummy trench 15 and the upper pn-junction 1051 can be smaller than 3 µm, smaller than 2 µm, or even smaller than 1 µm.

The barrier region 105 may be implemented as a contiguous barrier layer within the active region 1-2 of the IGBT 1, e.g., as said "carpet". As has been indicated above, both the bottom 155 of the dummy trench 15 and the bottom 145 of the control trench 14 may extend into the barrier region 105, e.g., both the dummy trench 15 and the control trench 14 may extend into the barrier region 105 by at least 100 nm, by at least 500 nm or by at least 1000 nm.

As has been stated above, the IGBT 1 may comprise a plurality of power unit cells 1-1, e.g., all of them included in the active region 1-2. For example, the barrier region 105 connects the inactive mesas 19 included in the plurality of power unit cells 1-1 with each other. For example, to this end, the barrier region 105 may extend partially into each of the inactive mesas 19, e.g., in a manner as schematically illustrated with respect to one power unit cell 1-1 in FIG. 2.

Referring further to the illustrations in FIG. 3, in an embodiment, the barrier region 105 may comprise one or more recesses 1053, wherein the drift region 100 extends entirely into each of the one or more recesses 1053, and wherein the one or more recesses 1053 laterally overlap with the active mesa 18.

For example, in some selected positions of the active region 1-2, the p-type barrier region 105 can, at trench bottoms 155, 145, 165, can be masked, e.g., to provide unobstructed path to the electron injection and avoid snap-back effects in the IGBT output characteristic.

Adhering to the visual vocabulary introduced above, the barrier region 105 may be implemented as a "patchwork carpet", wherein the one or more recesses 1053 are entirely filled with sections of the drift region 100. The dimensions, the positions and the numbers of recesses 1053 can be chosen in accordance with the cell configuration. For example, if the one or more power unit cells 1-1 are implemented as a stripe cells, stripe like recesses 1053 may be appropriate (cf. variant A). Alternatively, a plurality of small cellular formed recesses 1053 (cf. variants B and D) or a singular larger recesses 1053 (cf. variant C) may be provided.

For example, the one or more recesses 1053 provide for a load current passage. Thus, in accordance with an embodiment, the load current conducted by the semiconductor body 10 does not have to traverse the barrier region 105, but may path through the one or more recesses 1053.

For example, the barrier region 105 is absent, i.e., exhibits said at least one recess 1053, in a vertical projection (along the extension direction Z) of the inversion channels that may be induced in the active mesas 18. In this respect, it is recalled that, within each of one or more of the power unit cells 1-1, the source region 101 may be laterally structured along the second lateral direction Y. This lateral structure of the source region 101 may at least partially be reflected by corresponding positions of the recesses 1053 in the barrier region 150.

Figure 9:
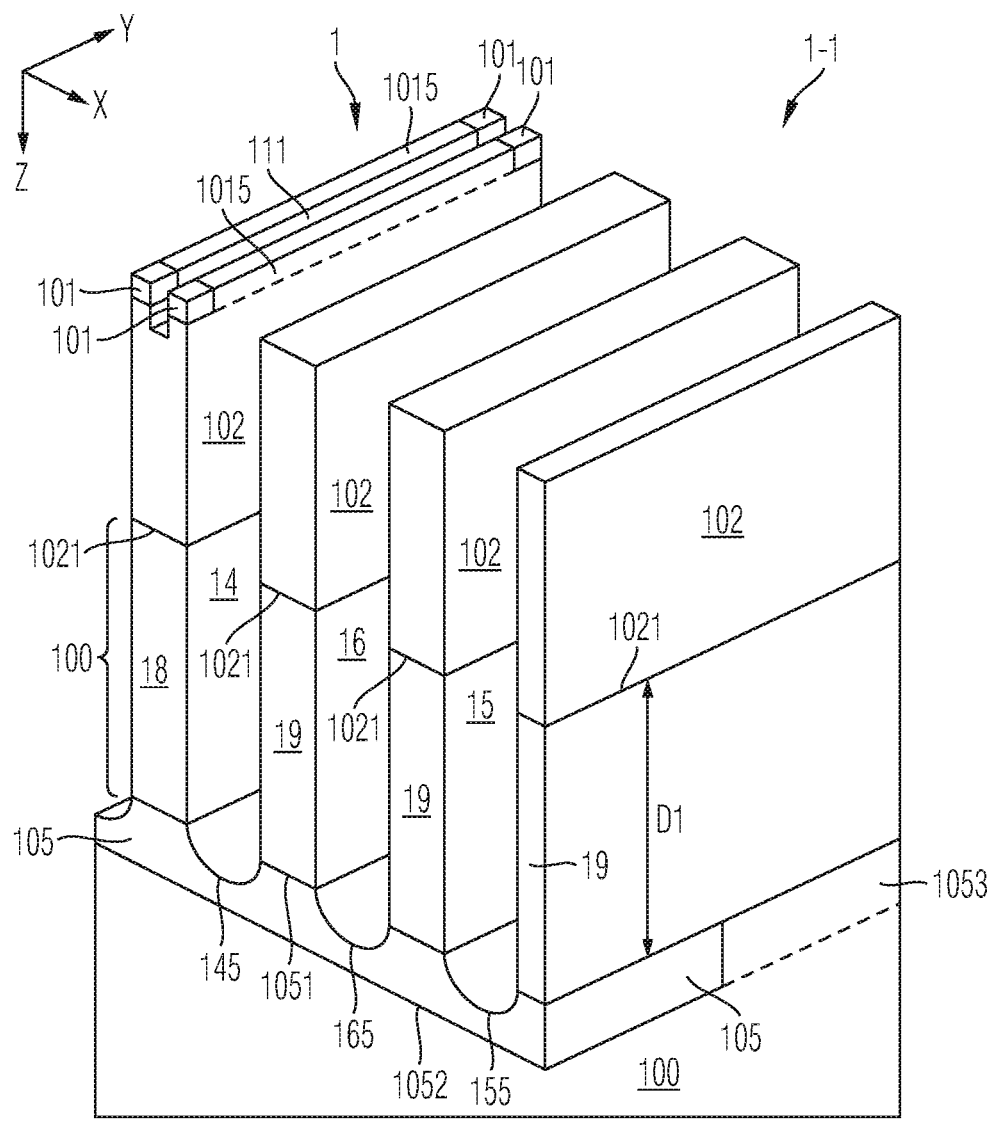
FIG. 9 schematically and exemplarily illustrates a section of a perspective projection of a power semiconductor transistor in accordance with one or more embodiments.

At this occasion, it shall be understood that the herein described lateral overlap that may be present between the barrier region 105 and other portions of the power unit cell(s) 1-1, e.g., at least one of the active mesa 18 and the dummy trench 15, refers to a section of a vertical cross-section of the IGBT 1, e.g., in parallel to the plane defined by the first lateral direction X and the extension (vertical) direction Z, e.g., to a section where the barrier region 105 does not exhibit one or more of said recess(es) 1053. This is, e.g., more clearly shown in the schematic and exemplary illustration of FIG. 9; there, the barrier region 105 has a stripe-like recess 1053 that extends longitudinally along the first lateral direction X. Of course, in the region where such recess 1053 is present, there cannot be a lateral overlap between the barrier region 105 and other portions of the power unit cell(s) 1-1. Further, as also illustrated in FIG. 9, the introductorily mentioned and optional lateral structure of the source region 101 is exemplarily implemented; accordingly, in an embodiment, the source region 101 may be structured along the second lateral direction Y within the respective power unit cell 1-1. For example, the source region is only locally provided, with intermission regions 1015 (e.g., formed by the channel region 102 of the second conductivity type) separating adjacent local source regions 101 along the second lateral direction Y. Further, at least some of the local source regions 101 may laterally overlap with the at least one recess 1053, as exemplarily illustrated in FIG. 9.

Referring to the embodiment schematically illustrated in FIG. 6, the at least one power unit cell 1-1 of the IGBT 1 may further comprise at least one source trench 16 that extends into the semiconductor body 10 along the extension direction Z and includes an insulator 162 that insulates a source trench electrode 161 from the semiconductor body 10, the source trench electrode 161 being electrically connected to the first load terminal 11.

For example, the at least one source trench 16 is arranged between the control trench 14 and the dummy trench 15, as illustrated in FIG. 6. In an embodiment, the at least one power unit cell 1-1 may comprise more than one source trench 16, e.g., two source trenches 16, wherein each of the trench electrodes 161 of the source trenches may be electrically connected to the first load terminal 11. For example, the more than one source trenches 16 are arranged between the control trench 14 on the one side and the dummy trench 15 on the other side.

In an embodiment, the active mesa 18 may be laterally confined by the control trench 14 and the source trench 16. For example, the sidewall 144 of the control trench 14 and a sidewall 164 of the source trench 16 confine the active mesa 18 along the first lateral direction X. The active mesa 18 may be configured in a manner that has exemplarily been described with respect to FIG. 2; e.g., the contact plug 111 may electrically connect both the section of the channel region 102 and the section(s) of the source region 101 to the first load terminal 11.

Further, in accordance with the embodiment illustrated in FIG. 6, the at least one power unit cell 1-1 may comprise more than one inactive mesas 19, wherein at least one of the inactive mesas 19 can be laterally confined by the source trench 16 and the dummy trench 15. Another inactive mesa 19 can be laterally confined by two source trenches 16. As illustrated, each of the inactive mesas 19 may comprise a respective section of the channel region 102, wherein, in an embodiment, these sections are not electrically connected to the first load terminal 11 but electrically insulated therefrom, e.g., by means of the insulation layer 112.

Referring to the embodiment schematically illustrated in FIG. 5, the at least one power unit cell 1-1 of the IGBT 1 may further comprise, in addition to or as an alternative to the at least one source trench 16, at least one floating trench 17 that extends into the semiconductor body 10 along the extension direction Z and includes an insulator 172 that insulates a trench electrode 171 from the semiconductor body 10, the trench electrode 171 of the floating trench 17 being electrically floating.

Regarding the electrical potential of the electrically floating trench electrode 171, the exemplary description of the embodiment according to which the barrier region 105 is electrically floating may analogously apply to the electrically floating trench electrode 171. Hence, in an embodiment, the trench electrode 171 of the floating trench 17 is neither electrically connected to the first load terminal 11, nor electrically connected to the second load terminal 12, nor electrically connected to the control terminal 13, nor to a section of the semiconductor body 10. For example, in an embodiment, the electrically floating trench electrode 171 can be connected, by means of a connection having a high ohmic resistance, to a defined electrical potential (e.g., to an electrical potential of a contact or to an electrical potential of another semiconductor region). For example, by means of said high ohmic connection, during a switching operation of the IGBT 1, the electrical potential of the electrically floating trench electrode 171 is temporarily decoupled from the defined electrical potential. Said decoupling may occur on a time scale of said switching operation, e.g., for at least 10 ns, or at least 100 ns, or at least 10 μs. For example, the resistance of said high ohmic connection amounts to more than 1e2, or to more than 1e6. In an embodiment, an ohmic resistance, e.g. measured during a standstill situation, between the first load terminal 11 and the electrically floating trench electrode 171 amounts to more than 1e2, or to more than 1e6.

For example, the at least one floating trench 17 can be arranged between the control trench 14 and the dummy trench 15. Further, as illustrated in FIG. 5, the power unit cell 1-1 may additionally comprise at least one source trench 16, wherein the source trench 16 and the floating trench 17 may be arranged between the control trench 14 on the one side and the dummy trench 15 on the other side. In an embodiment, the active mesa 18 is laterally confined by the sidewall 144 of the control trench 14 and the sidewall 164 of the source trench 16. The inactive mesa 19 may be laterally confined by at least two of the group of the sidewall 164 of the source trench 16, the sidewall 174 of the floating trench 17, and the sidewall 154 of dummy trench 15.

Thus, in accordance with the embodiment of FIG. 6, the least one power unit cell 1-1 comprises both the at least one source trench 16 and the at least one floating trench 17, wherein the at least one source trench 16 and the at least one floating trench 17 are arranged between the control trench 14 and the dummy trench 15.

In an embodiment, the IGBT 1 and each of its power unit cells 1-1 may exhibit a micro pattern trench (MPT) structure.

For example, each of the trenches 14, 15, 16, 17 that may be included in the power unit cell 1-1 may, e.g., exhibit equal spatial dimensions, and may be arranged in accordance with a regular pattern. For example, each of the trenches 14, 15, 16, 17 may exhibit a depth along the extension direction Z within the range of 3 μm to 8 μm, and a width along the first lateral direction X within the range of 0.4 μm to 1.6 μm.

Further, each of the trench electrodes 141, 151, 161, 171 of all trenches 14, 15, 16, 17 that may be included in the at least one power unit cell 1-1 may exhibit equal spatial dimensions. In addition, each of the trenches 14, 15, 16, 17 that may be included in the at least one power unit cell 1-1 can be arranged equidistantly along the first lateral direction X. Hence, both mesas 18 and 19 of each power unit cell 1-1 may exhibit the same first width, which may be within the range of 0.1 μm to 0.3 μm, within the range of 0.3 μm to 0.8 μm, or within the range of 0.8 μm to 1.4 μm.

In another embodiment, each of the trenches 14, 15, 16, 17 that may be included in the at least one power unit cell 1-1 are not arranged equidistantly along the first lateral direction X. For example, in such embodiment, the inactive mesa 19 may exhibit a greater width than the active mesa 18, e.g., the width of the inactive mesa 19 may amount to at least 150% of the width of the active mesa 18.

Further, each of the trenches 14, 15, 16, 17 that may be included in the power unit cell 1-1 may extend into the barrier region 105, e.g., by at least 100 nm, by at least 500 nm or by at least 1000 nm.

For the following explanations, the following abbreviations may apply:
G=control trench 14
D=dummy trench 15
S=source trench 16
F=floating trench 17
k=active mesa 18
o=inactive mesa 19

As has been stated above, the IGBT 1 may comprise a plurality of equally configured power unit cells 1-1. In an embodiment, using the applications introduced above, exemplary neighborhood relationship within in each power unit cell 1-1 may be expressed as follows:

exemplary neighborhood relationship #1: kGkSoSoDoDoSoS exemplary neighborhood relationship #2: kGkSoFoDoDoDoDoFoS exemplary neighborhood relationship #3: kGkSoSoDoDoSoS exemplary neighborhood relationship #4: GkSoSoD (cf. FIGS. 10 to 13)

exemplary neighborhood relationship #5: SkGoSoD (cf. FIG. 14)

With respect to all embodiments discussed above, it shall be understood that, in accordance with a variant, the sections of the drift region 100 that are included in the mesas 18 and 19, e.g., the sections forming the first pn-junction 1021 with the channel region 102 and the upper pn-junction 1051 with the barrier region 1051 (i.e., those sections of the drift region causing the distance D1), may, in an embodiment, have the same or another, e.g., higher dopant concentration as compared to the dopant concentration of the section of the drift region 100 arranged below the barrier region 105. In an embodiment, these sections of the drift region 100 included in the mesas 18 and 19 exhibit a dopant concentration significantly greater (e.g., up to five orders of magnitude ($10^5$) as great) as the dopant concentration of the section of the drift region 100 arranged below the barrier region 105, e.g., the section of the drift region 100 that forms the lower pn-junction 1052 with the barrier region 105. Said sections of the drift region 100 that are included in the mesas 18 and 19 may each exhibit a maximum dopant concentration within the range of 1e14 $cm^{-3}$ to 1e18 $cm^{-3}$, e.g., a maximum dopant concentration of at least 1e16 $cm^{-3}$. For example, said sections of the drift region 100 that are included in the mesas 18 and 19 and that may exhibit said increased dopant concentrations can be referred to as "n-barrier regions". For example, the dopant concentration of the sections of the drift region 100 that are included in the mesas 18 and 19 is chosen such that the upper pn-junction 1051 remains at a level slightly above the trench bottoms 145 and 155.

In an embodiment, these n-barrier regions, i.e., the sections of the drift region 100 that are included in the mesas 18 and 19 and forming the first pn-junction 1021 with the channel region 102 and the upper pn-junction 1051 with the barrier region 1051, are formed by means of an implantation processing step. Hence, the dopant concentration and the distance D1 between the first pn-junction 1021 and the upper pn-junction 1051 can be controlled by means of the implantation processing step and/or by a thermal diffusion processing step carried out thereafter.

Figure 8:
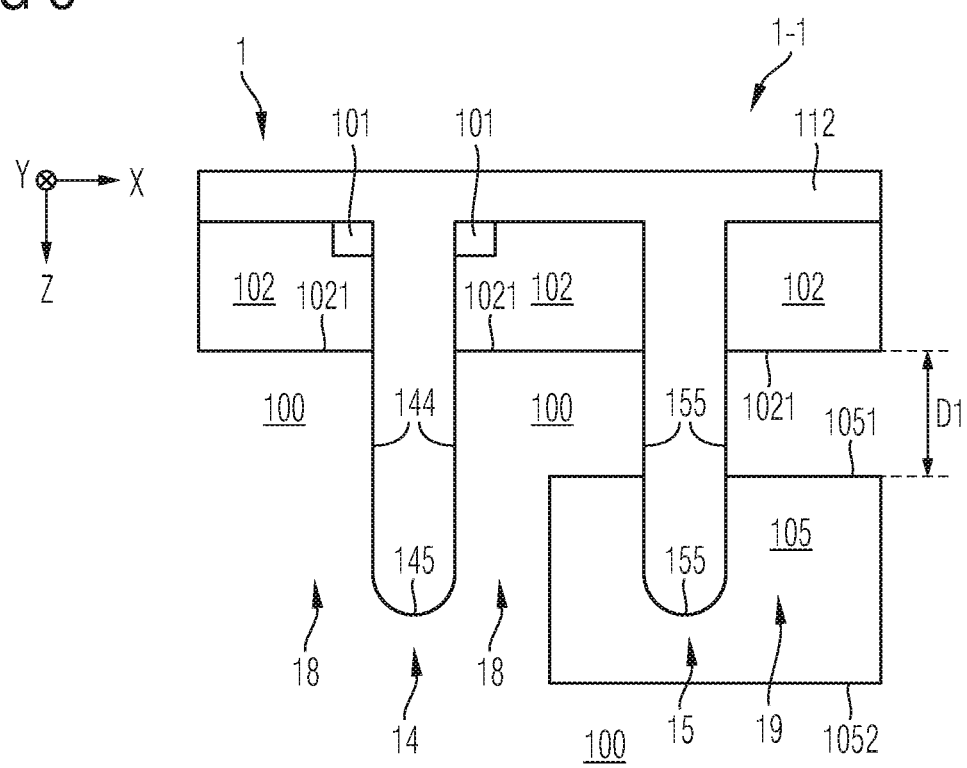
FIG. 8 schematically and exemplarily illustrates a section of a vertical cross-section of a power semiconductor transistor in accordance with one or more embodiments.

For example, as illustrated in FIG. 8, according to an embodiment, a power semiconductor transistor 1 comprises: a semiconductor body (cf. reference numeral 10 in the other drawings) coupled to a first load terminal (cf. reference numeral 11 in the other drawings) and a second load terminal (cf. reference numeral 12 in the other drawings) of the transistor 1 and comprising a drift region 100 of a first conductivity type configured to conduct a load current between said terminals. The transistor 1, e.g., an IGBT, further comprises at least one power unit cell 1-1 including: at least one control trench 14 having a control trench electrode 141; at least one dummy trench (cf. reference numeral 15 in the other drawings) having a dummy trench electrode (cf. reference numeral 151 in the other drawings) coupled to the control trench electrode; at least one active mesa 18 comprising a source region 101 of the first conductivity type and electrically connected to the first load terminal and a channel region 102 of the second conductivity type and separating the source region 101 and the drift region 100, wherein, in the active mesa 18, at least a respective section of each of the source region 101, the channel region 102 and the drift region 100 are arranged adjacent to a sidewall 144 of the control trench 14, and wherein the control trench electrode 141 is configured to receive a control signal from a control terminal (cf. reference numeral 13 in the other drawings) of the transistor 1 and to control the load current in the active mesa 18. Further, a semiconductor barrier region 105 of the second conductivity type is implemented in the semiconductor body, the barrier region 105 laterally overlapping both with at least 50% of a width of the active mesa 18 and with the bottom 155 of the dummy trench 15. As has been explained above, the lateral overlap between the active mesa 18 and the barrier region 105 may be greater than 50%, e.g., greater than 75% or even greater than 90%. For example, except for the one or more recesses 1053, the barrier region 105 entirely laterally overlaps with both active mesas 18 and the dummy trench bottoms 155 of the power unit cells 1-1 of the IGBT 1.

As emphasized above, the channel region 102 can form said first pn-junction 1021 with the drift region 100, the first pn-junction 1021 being present within the at least one active mesa 18, wherein the distance D1 along a vertical direction Z between the first pn-junction 1021 and the upper pn-junction 1051 amounts to at least 150 nm. This distance D1 may be formed by a section of the drift region 100, and it may equally be present within the inactive mesa 19, e.g., within all mesas 18, 19 of the power unit cell 1-1. The value of the distance D1 may be adjusted, as described above, by means of adjusting a dose of an implantation processing step applied to form the drift region 100 above (with respect to the vertical direction Z) the barrier region 105. For example, the section of the drift region 100 arranged above the upper pn-junction 1051 has a dopant concentration within the range of 90% to five orders of magnitude ($10^5$) of a dopant concentration of the section of the drift region 100 arranged below the upper pn-junction 1051. Hence, the dopant concentrations of said drift regions sections below and above the barrier region 105 may be substantially identical to each other, or, the dopant concentration of the drift region 100 within the mesas 18, 19 and above the barrier region 105 may be significantly greater than the dopant concentration of the drift region section 100 below the barrier region 105.

As has also already been described above, the section of the drift region 100 arranged above the upper pn-junction 1051 can have a dopant concentration formed at least partially by an implanted dopant.

Now referring to FIGS. 10 to 22, further embodiments shall be described. At this point, it is emphasized that the features of the embodiments already described above may equally apply to the embodiments described in the following, and vice versa. For example, with respect to FIGS. 10 to 22, trench electrodes with a reduced volume share will be exemplarily described. These exemplary trench volume reductions are not expressively illustrated in FIGS. 1 to 6, 8 and 9; but, it shall be understood that also the embodiments described with respect to FIGS. 1 to 6, 8 and 9 may exhibit reduced volume share trench electrodes exemplarily described with respect to FIGS. 10 to 22. Vice versa, everything what has been stated above with respect to the first load terminal 11, the second load terminal 12, the control terminal, the semiconductor body 10, the doped contact region 108, the drift region 100, the barrier region 105, the channel region 102, the source region 101, the pn-junctions 1052, 1051 and 1021, the plugs 111, the trenches 14, 15, 16, 17 and the mesas 18 and 19 etc. may equally apply to embodiments described in the following with respect to FIGS. 10 to 22. However, the barrier region 105 is optional for the embodiments illustrated in FIGS. 10 to 22. That is, even though the barrier region 105 is shown in some of FIGS. 10 to 22, the barrier region 105 may be omitted from one, some or all embodiments illustrated in FIGS. 10 to 22.

In accordance with embodiments describes herein, the at least one control trench 14 has a total control trench volume, the volume of the control trench electrode 141 amounting to less than 80% of the total control trench volume. Additionally or alternatively, the at least one dummy trench 15 has a total dummy trench volume, the volume of the dummy trench electrode 151 amounting to less than 80% of the total dummy trench volume. The reduced volume share of at least one of the trench electrodes 141, 151 will become more apparent from, e.g., the schematic and exemplary illustrations in FIGS. 10 to 16.

For example, the volume of the control trench electrode 141 amounts to less than 70% of the total control trench volume, or to even less than 50% of the of the total control trench volume. Additionally or alternatively, for example, the volume of the dummy trench electrode 151 amounts to less than 70% of the total dummy trench volume, or to even less than 50% of the of the total dummy trench volume.

The total trench volume can be the volume of the respective trench integrated, within the active region 1-2, along the lateral directions X and Y and the vertical direction Z, and may include the trench insulator. For example, referring to FIG. 10, the total volume of the control trench 14 may be the integration of the area confined by the control trench sidewalls 144 and the control trench bottom 145 and the control trench top (intersection to the insulation layer 112) along the second lateral direction Y along the entire extension in the second lateral direction Y of the control trench 14 within the active region 1-2 (cf. FIG. 1). Analogously, the total volume of the dummy trench 15 may be the integration of the area confined by the dummy trench sidewalls 155 and the dummy trench bottom 155 and the dummy trench top (intersection to the insulation layer 112) along the second lateral direction Y along the entire extension in the second lateral direction Y of the dummy trench 15 within the active region 1-2 (cf. FIG. 1). An analogous definition of the trench volume may apply to the source trench(es) 16 and the floating trench(es) 17, if present.

The reduction of the volume share of at least one of the trench electrodes 141, 151 that may be coupled to the control terminal 13 of the IGBT 1 may yield a reduced total gate charge of the IGBT 1, which may improve the controllability. The reduction of the volume share of at least one of the trench electrodes 141, 151 may be implemented in each of the power unit cells 1-1 of the IGBT 1.

In an embodiment, due to the trench electrode volume reduction, the ratio of the capacitance formed between the control terminal 13 and the first load terminal 11 (also referred to as $C_{GE}$) and the capacitance formed between the control terminal 13 and the second load terminal 12 (also referred to as $C_{GC}$) is greater than one hundred, i.e., $C_{GE}/C_{GC} > 100$. In particular, in combination with the optional barrier region 105 as described above, this may yield an appropriate controllability of the transistor 1.

As will be understood by the skilled persons, there are various ways of achieving such volume share reduction, some of which will now be explained with respect to FIGS. 10 to 22.

For example, the IGBT 1 in accordance with FIGS. 10 to 16 has one or more power unit cells 1-1 exhibiting a certain contacting scheme, e.g., "GkSoSoD", as explained above. Each trench 14, 15, 16 of the power unit cell 1-1 may be considered to have an upper portion UP starting at the insulation layer 112 and extending along the vertical direction Z until it seamlessly joins into a respective lower portion LP. For example, each trench 14, 15, 16 may exhibit a total extension along the vertical direction Z, measured from the insulation layer 112 down to the respective trench bottom 145, 155, 165. The lower portion LP can be formed by the deepest third part of the respective trench, and the upper portion UP can be formed by the upper first two third parts of the respective trench. The same division into an upper portion UP and a lower portion LP may apply to the mesas 18, 19 of the power unit cell 1-1.

For example, the remaining share of the total control trench volume and/or the remaining share of the total dummy trench volume is formed by an insulating material and/or an electrode material separated from the respective trench electrode 141, 151. For example, each trench insulator comprises an insulator block 147, 157, 167 that divides the respective trench 14, 15, 16 into two sections, e.g., along the vertical direction, one of which extending into the upper portion UP, the other extending into the lower portion LP. The insulator blocks 147, 157, 167 may extend laterally between the respective trench sidewalls 144, 154, 164.

In an embodiment, the dummy trench electrode 151 is arranged in the lower portion LP of the dummy trench 15, the lower portion LP vertically overlapping with the optional barrier region 105. For example, the dummy trench electrode 151 is arranged below the trench insulator block 157, wherein the trench insulator block 157 may be positioned at a vertical level corresponding to approximately half of the total extension of the dummy trench 15 along the vertical direction.

Figure 10:
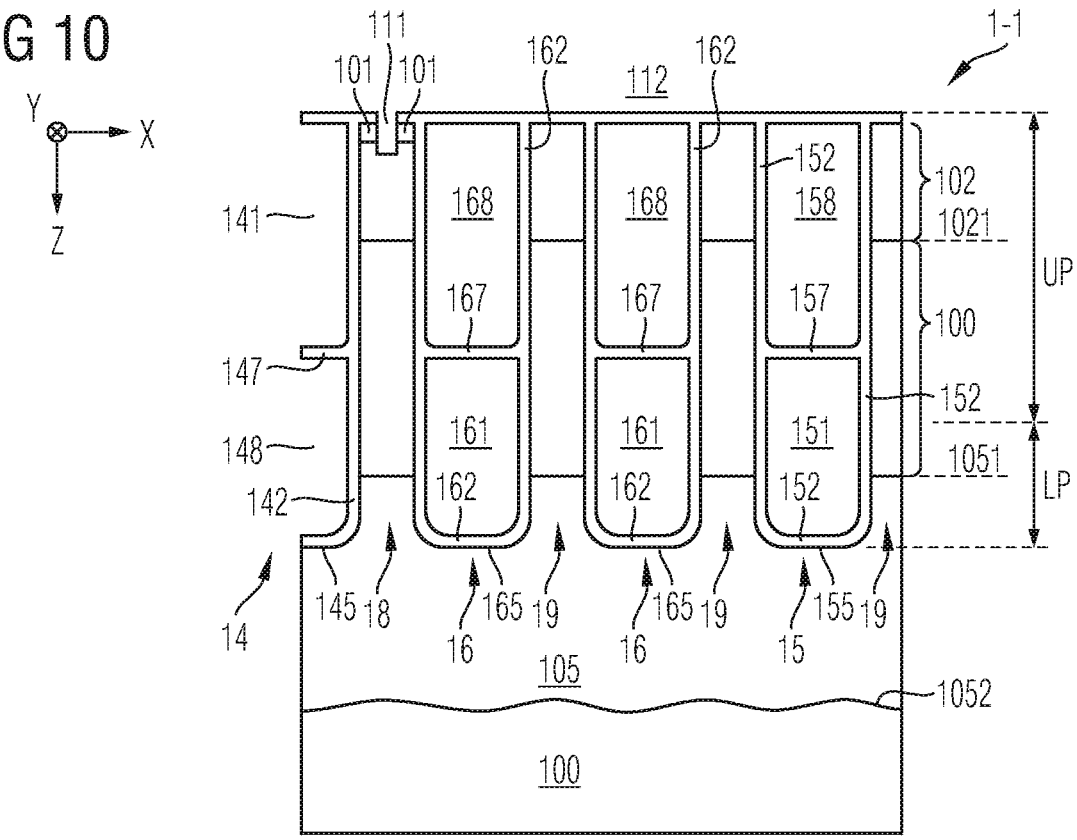

For example, as illustrated in FIG. 10, the dummy trench electrode 151 does not vertically overlap with the channel region 102; e.g., the distance between the dummy trench electrode 151 and the first pn-junction 1021 along the vertical direction Z amounts to at least 50% of the distance D1 mentioned above.

In contrast, the control trench electrode 141 can be arranged in the upper portion UP of the control trench 14, the upper portion UP vertically overlapping with the channel region 102. Such vertical overlap may facilitate control of the load current in the active mesa 18.

In accordance with an embodiment, the dummy trench 15 includes a second trench electrode 158. For example, also the control trench 14 may include a second trench electrode 148, and also the source trench 16 may include a second trench electrode 168. In an embodiment, each trench 14, 15, 16 of the power unit cell 1-1 includes a respective second trench electrode 148, 158, 168. In each trench 14, 15, 16, the trench electrodes 141, 148, 151, 158, 161, 168 may be separated from each other, e.g., by means of the insulator blocks 147, 157, 167 mentioned above.

For example, the second trench electrode 158 of the dummy trench 15 has another electrical potential than the dummy trench electrode 151; e.g., the trench electrodes 151 and 158 of the dummy trench 15 are electrically insulated from each other. For example, the second trench electrode 158 of the dummy trench 15 is electrically connected to the first load terminal 11. Or, the second trench electrode 158 of the dummy trench 15 can be electrically floating. In another embodiment, the second trench electrode 158 of the dummy trench 15 is electrically connected to another potential.

In an embodiment, the dummy trench electrode 151 of the dummy trench 15 has a first share of total dummy trench volume, and the second trench electrode 158 of the dummy trench 15 has a second share of total dummy trench volume. For example, the second share is greater than the first share.

Further, the second trench electrode 158 of the dummy trench 15 can be arranged above the dummy trench electrode 151. For example, the second trench electrode 158 of the dummy trench 15 may extend into the upper portion UP of the dummy trench 15, and the dummy trench electrode 151 may extend into the lower portion LP of the dummy trench 15. For example, the second trench electrode 158 of the dummy trench 15 does not extend into the lower portion LP of the dummy trench 15.

For example, the second trench electrode 148 of the control trench 14 has the same electrical potential as the control trench electrode 141; e.g., the trench electrodes 141 and 148 of the control trench 14 can be electrically connected to each other. For example, the second trench electrode 148 of the control trench 14 is electrically connected to the control terminal 13. Or, the second trench electrode 148 of the control trench 14 can be electrically floating. In another embodiment, the second trench electrode 148 of the control trench 14 is electrically connected to another potential.

In an embodiment, the control trench electrode 141 of the control trench 14 has a first share of total control trench volume, and the second trench electrode 148 of the control trench 14 has a second share of total control trench volume. For example, the second share is greater than the first share.

Further, the second trench electrode 148 of the control trench 14 can be arranged below the control trench electrode 141. For example, the second trench electrode 148 of the control trench 14 may extend into the lower portion LP of the control trench 14, and the control trench electrode 141 may extend into the upper portion UP of the control trench 14. For example, the control trench electrode 141 does not extend into the lower portion LP of the control trench 14.

For example, the second trench electrode 168 of the source trench 16 has another electrical potential than the source trench electrode 161; e.g., the trench electrodes 161 and 168 of the dummy trench 15 are electrically insulated from each other. In another embodiment, the second trench electrode 168 of the source trench 16 is also electrically connected to the first load terminal 11. Or, the second trench electrode 168 of the source trench 16 can be electrically floating. In another embodiment, the second trench electrode 168 of the source trench 16 is electrically connected to another potential.

In an embodiment, the source trench electrode 161 of the source trench 16 has a first share of total source trench volume, and the second trench electrode 168 of the source trench 16 has a second share of total source trench volume. For example, the second share is greater than the first share.

Further, the second trench electrode 168 of the source trench 16 can be arranged above the source trench electrode 161. For example, the second trench electrode 168 of the source trench 16 may extend into the upper portion UP of the source trench 16, and the source trench electrode 161 may extend into the lower portion LP of the source trench 16. For example, the second trench electrode 168 of the source trench 16 does not extend into the lower portion LP of the source trench 16.

Figure 11:
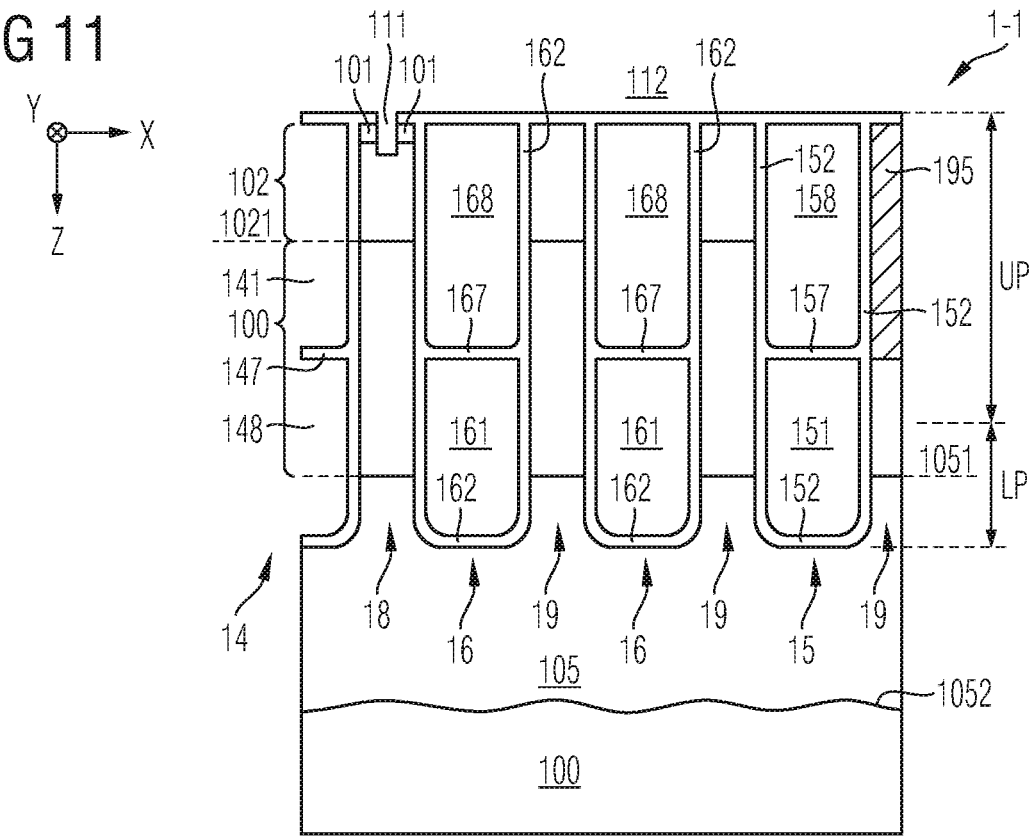

Now regarding the embodiment of FIG. 11, at least one of the inactive mesas 19 of the power unit cell 1-1 may include an oxidized region 195 or a region 195 with another insulating material. For example, the region 195 extends down to a level where the insulator blocks 147, 157, 167 are positioned that separate the trenches 14, 15, 16 into respective trench sections along the vertical direction Z. Hence, the region 195 may be arranged in the upper portion UP of the inactive mesa 19. For example, the region 195 vertically overlaps, e.g., entirely, with the channel region 102. The region 195 may fill at least the upper half of the entire upper portion UP of the inactive mesa 19. This can effectively reduce the capacitive coupling between the trenches due to the thick oxide.

In accordance with the embodiment of FIG. 12, the active mesa 18 includes the source region only adjacent to one side of the contact plug 111; hence, as explained in greater detail above, the active mesa 18 includes an active mesa portion (left side) and an inactive mesa portion (right to the contact plug 111). As further illustrated in FIG. 12, only the dummy trench 15 includes the second trench electrode 158; the other trenches 14, 16 of the power unit cell 1-1 do not exhibit such split electrode configuration. Depending on the process, this may yield improved reliability.

The embodiment illustrated in FIG. 13 is almost identical to the embodiment of FIG. 10, wherein a second contact plug 115 is provided to contact at least one of the inactive mesas 19 of the power unit cell 1-1. As mentioned above, the inactive mesa 19 may be electrically connected to the first load terminal; however, the transition 191 between the first load terminal 11 and the inactive mesa 19 nevertheless provides an electrical insulation at least for charge carriers of the first conductivity type. The inactive mesa 19 may hence be configured at allow a current of charge carriers of the second conductivity type, e.g., a hole current, to pass said transition 191. For example, depending on the electrical potential of the trench electrode of the trench adjacent to the inactive mesa 19, e.g., the trench electrodes 151, 158, 161, 168, such hole current may only temporarily come into being, e.g., shortly before carrying out a turn-off operation, e.g., to reduce the total charge carrier concentration present in the semiconductor body 10. As stated above, in such exemplary configuration, the inactive mesa 19 may be electrically connected to the first load terminal 11. For example, the channel region 102 of the second conductivity type extends into the inactive mesa 19 and may be electrically connected to the first load terminal 11, e.g., by means of the contact plug 115. The channel region 102 that extends into the inactive mesa 19 may isolate the section of the drift region 100 that is present within the inactive mesa 19 from the first load terminal 11. For example, within the inactive mesa 19, there is no region doped with dopants of the first conductivity type that is electrically connected to the first load terminal 11. Hence, the contact plug 115 does, e.g., not reach below the first pn-junction 1021 formed within the inactive mesa 19.

Still referring to FIG. 13, in an embodiment in which the optional barrier region is included, the above described optional increased dopant concentration of the drift region section 100 above the upper pn-junction 1051 is only applied in the mesas 18, 19 that are electrically connected to the first load terminal 11. For example, in the non-contacted mesas 18, 19, the dopant concentration of the section of the drift region 100 above the upper pn-junction 1051 is substantially the same as the section of the drift region 100 below the lower pn-junction 1052. This may allow to increase the charge carrier concentration in the on-state of the transistor 1; at the same time, the transistor 1 can exhibit only small effects on the electrical potential around the dummy trench 15 during turn-on.

Figure 14:
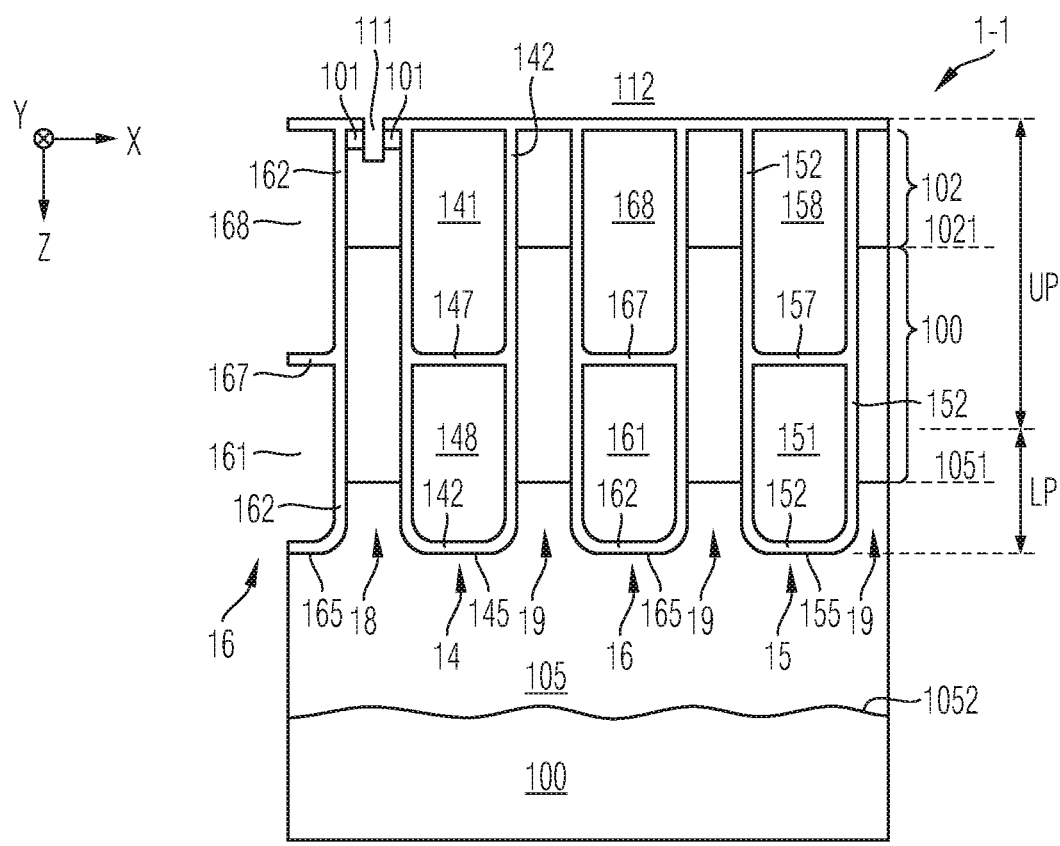

FIG. 14 shows an embodiment similar to the embodiment of FIG. 10, but with the active mesa 18 comprising the inactive mesa portion (left to the contact plug 111) and with a different contacting scheme, namely "SkGoSoDo".

Figure 15:
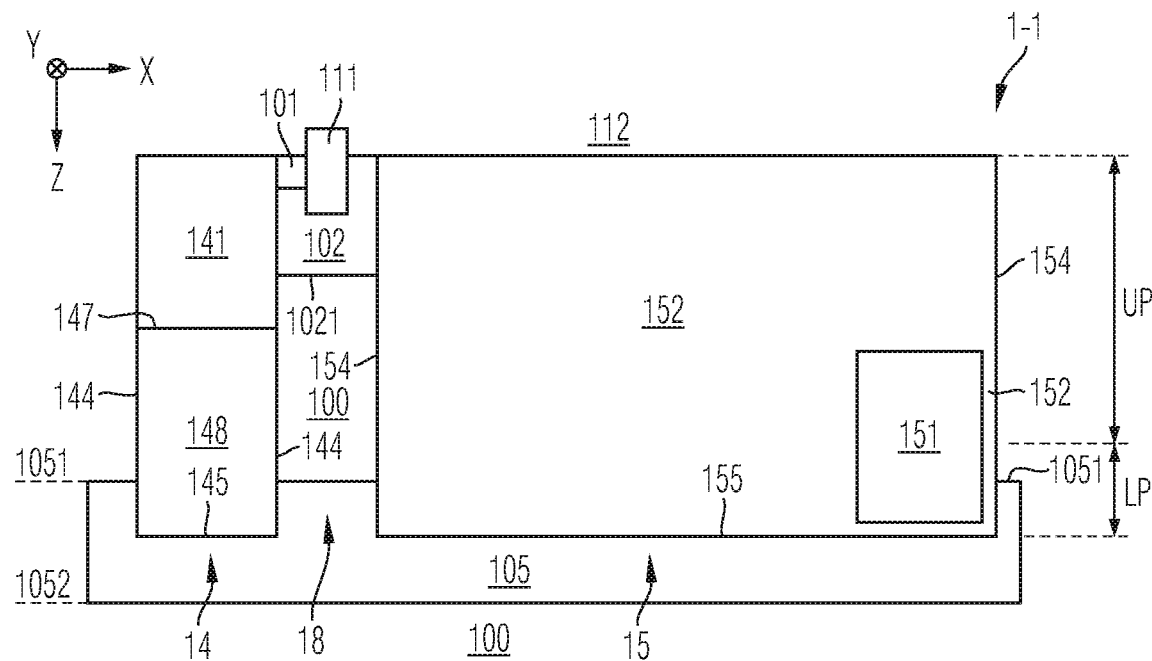

FIG. 15 exemplarily illustrates another option to reduce the volume share of the dummy trench electrode 151. For example, the dummy trench 15 does not exhibit said second electrode 158, but rather only the dummy trench electrode 151 and the dummy trench insulator 152.

In an embodiment, the dummy trench electrode 151 of the dummy trench 15 has a first share of total dummy trench volume, and the dummy trench insulator 152 of the dummy trench 15 has a second share of total dummy trench volume. For example, the second share is greater than the first share, e.g., the second share amounts to at least twice the first share, or to even more than three times the first share. For example, the dummy trench insulator 152 is a full-grown oxide.

For example, the dummy trench 15 exhibits a significantly greater width as the control trench 14; e.g., the dummy trench 15 is at least twice as wide as the control trench 14. Further, the width of the dummy trench electrode 151 can be less than 50% of the width of the dummy trench 15. Further, a total extension of the dummy trench electrode 151 in the vertical direction Z can be less than 50% of the total extension of the dummy trench 15 in the vertical direction Z. For example, the dummy trench electrode 151 is arranged in a lower corner of the dummy trench 15; e.g., not adjacent to the active mesa 18. The mesa to the right of the dummy trench 15 can be an inactive mesa 19.

Figure 16:
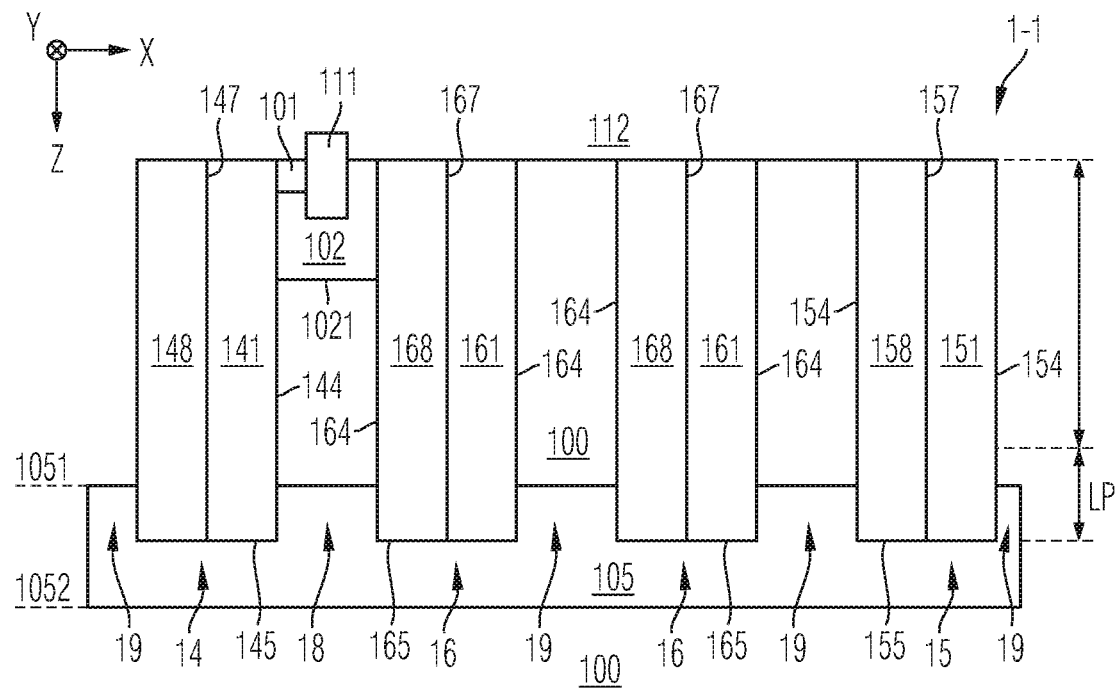

Now referring to FIG. 16, in an embodiment, the power unit cell 1-1 may exhibit the contacting scheme "GkSoSoD". Irrespective of the actual contacting scheme, the reduction of the volume share of at least one of the control trench electrode 141 and the dummy trench electrode 151 may also be achieved by the respective insulator block, e.g., insulator block 157, extend substantially vertically so to separate the respective trench into two laterally (instead of vertically) adjacent trench sections.

For example, the second trench electrode 158 of the dummy trench 15 is arranged laterally adjacent to the dummy trench electrode 151 and separated therefrom by means of the insulator block 157. For example, the second trench electrode 158 of the dummy trench 15 is electrically connected to the first load terminal 11. For example, the dummy trench electrode 151 of the dummy trench 15 has a first share of total dummy trench volume, and the second trench electrode 158 of the dummy trench 15 has a second share of total dummy trench volume. For example, the second share is substantially identical to the first share.

For example, the second trench electrode 148 of the control trench 14 is arranged laterally adjacent to the control trench electrode 141 and separated therefrom by means of the insulator block 147. For example, the second trench electrode 148 of the control trench 14 is also electrically connected to the first load terminal 11. For example, the control trench electrode 141 of the control trench 14 has a first share of total control trench volume, and the second trench electrode 148 of the control trench 14 has a second share of total control trench volume. For example, the second share is substantially identical to the first share. For example, the control trench electrode 141 is arranged laterally adjacent to the active mesa 18, and the second trench electrode 148 of the control trench 14 is arranged laterally adjacent to the active mesa 19.

For example, the second trench electrode 168 of the source trench 16 is arranged laterally adjacent to the source trench electrode 161 and separated therefrom by means of the insulator block 167. For example, the second trench electrode 168 of the source trench 16 is also electrically connected to the first load terminal 11. For example, the source trench electrode 161 of the source trench 16 has a first share of total source trench volume, and the second trench electrode 168 of the source trench 16 has a second share of total control trench volume. For example, the second share is substantially identical to the first share.

Regarding all embodiment described herein, it shall be made clear that irrespective of the said trench electrode volume reduction is implemented, the control trench electrode 141 can in any case be designed so as vertically overlap with the channel region 102 and be arranged laterally adjacent to the active mesa 18, and the dummy trench electrode 151 can in any case be designed so as vertically overlap with the optional barrier region 105.

Figure 17:
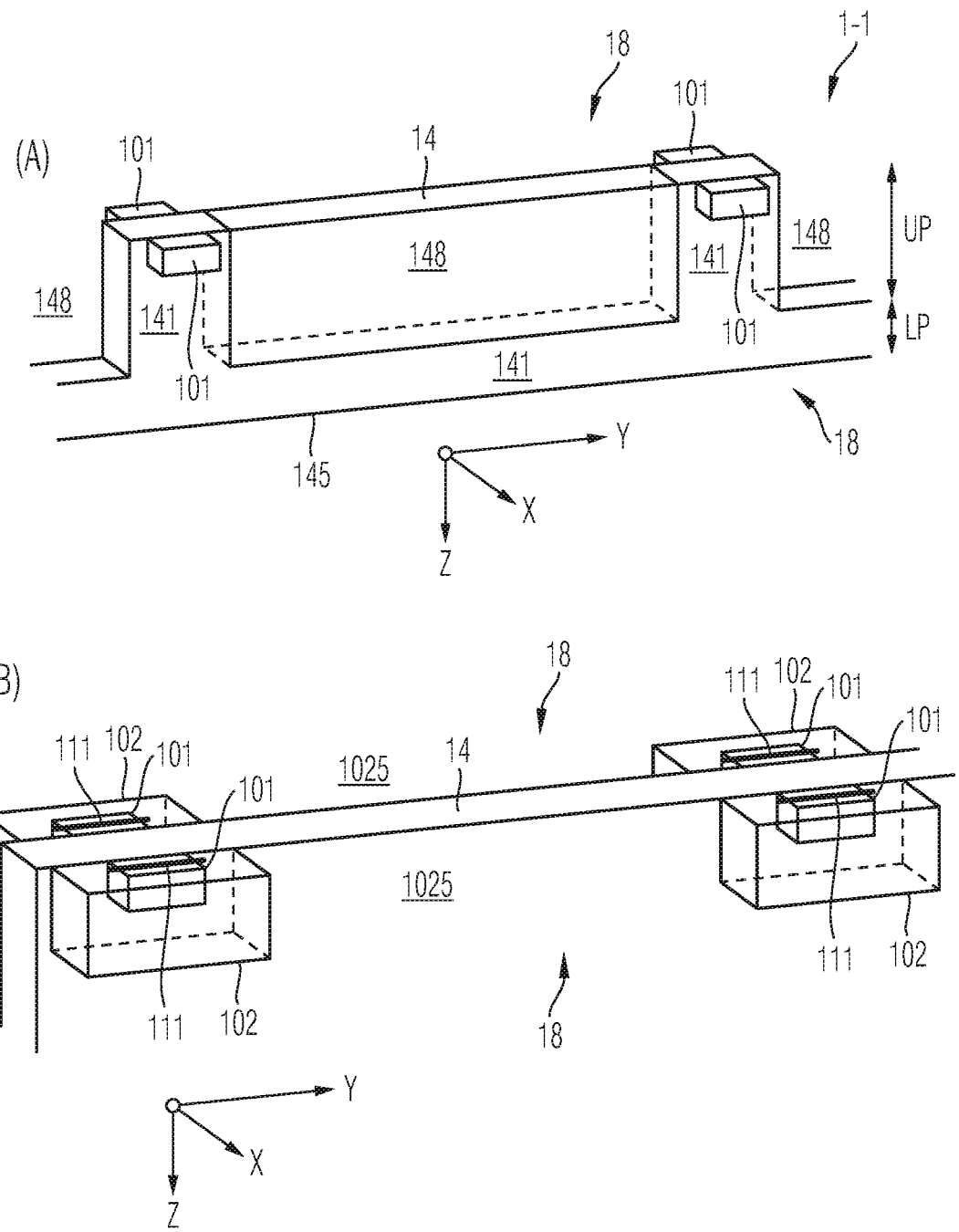
FIG. 17 schematically and exemplarily illustrates a section of a perspective projection of a power unit cell of a power semiconductor transistor in accordance with one or more embodiments.

As has been indicated above, the source region 101 can be structured along the second lateral direction Y. In this respect, FIG. 17 shows a section of a perspective projection of the power unit cell 1-1 in accordance with an embodiment. Accordingly, in this embodiment, the source region 101 is laterally structured along the second lateral direction Y, with intermission regions 1015 separating adjacent source subregions 101 (cf. also FIG. 9).

In the upper section A, FIG. 17 illustrates one control trench 14 and two active mesas 18 laterally adjacent thereto. The control trench 14 includes the control trench electrode 141 and the second trench electrode 148 (e.g., electrically connected to the first load terminal 11).

For example, the control trench electrode 141 is laterally structured along the second lateral direction Y according to the lateral structure of the source region 101 to laterally overlap with the source subregions 101.

For example, the control trench electrode 141 may further be vertically structured according to the lateral structure of the source region 101; e.g., the control trench electrode 141 only extends in both the upper portion UP and the lower portion LP where there is a lateral overlap with the source regions 101. For example, along the intermission regions 1015, the control trench electrode 141 only extends within the lower portion of the control trench 14. Above these regions, there may be arranged said second trench electrodes 148, as illustrated in FIG. 17, e.g., electrically connected to the first load terminal 11 or electrically floating. As mentioned above, instead of the second electrodes 148, the trench insulator 142 could be enlarged, e.g., by means of so-called oxide plugs.

Also, the dummy trench electrode 151 can be laterally structured along the second lateral direction Y according to the lateral structure of the source region 101 to laterally overlap with the source subregions 101. For example, the dummy trenches 15 are structured in the same manner as the control trenches 14, e.g., as illustrated in section A of FIG. 17.

Further, as illustrated the lower section B of FIG. 17, also the channel region 102 can be laterally structured along the second lateral direction Y, with intermission regions 1025 (e.g., of the first conductivity type) separating adjacent channel subregions 102, and wherein the control trench electrode 141 can further be laterally structured along the second lateral direction Y according to the lateral structure of the channel region 102 so as to laterally overlap with the channel subregions 102.

The lateral structure of the control trench electrode 141 or, respectively, of the dummy trench electrode 151 may include one or more of said second trench electrode 148, 158; e.g., in the control trench 14, the control trench electrode 141 and the second trench electrode 148 are arranged in alternating manner along the second lateral direction Y, e.g., such that the control trench electrodes 141 laterally overlap with the source (sub)regions 101. Further, in the dummy trench 15, the dummy trench electrode 151 and the second trench electrode 158 can be arranged in alternating manner along the second lateral direction Y.

Figure 18:
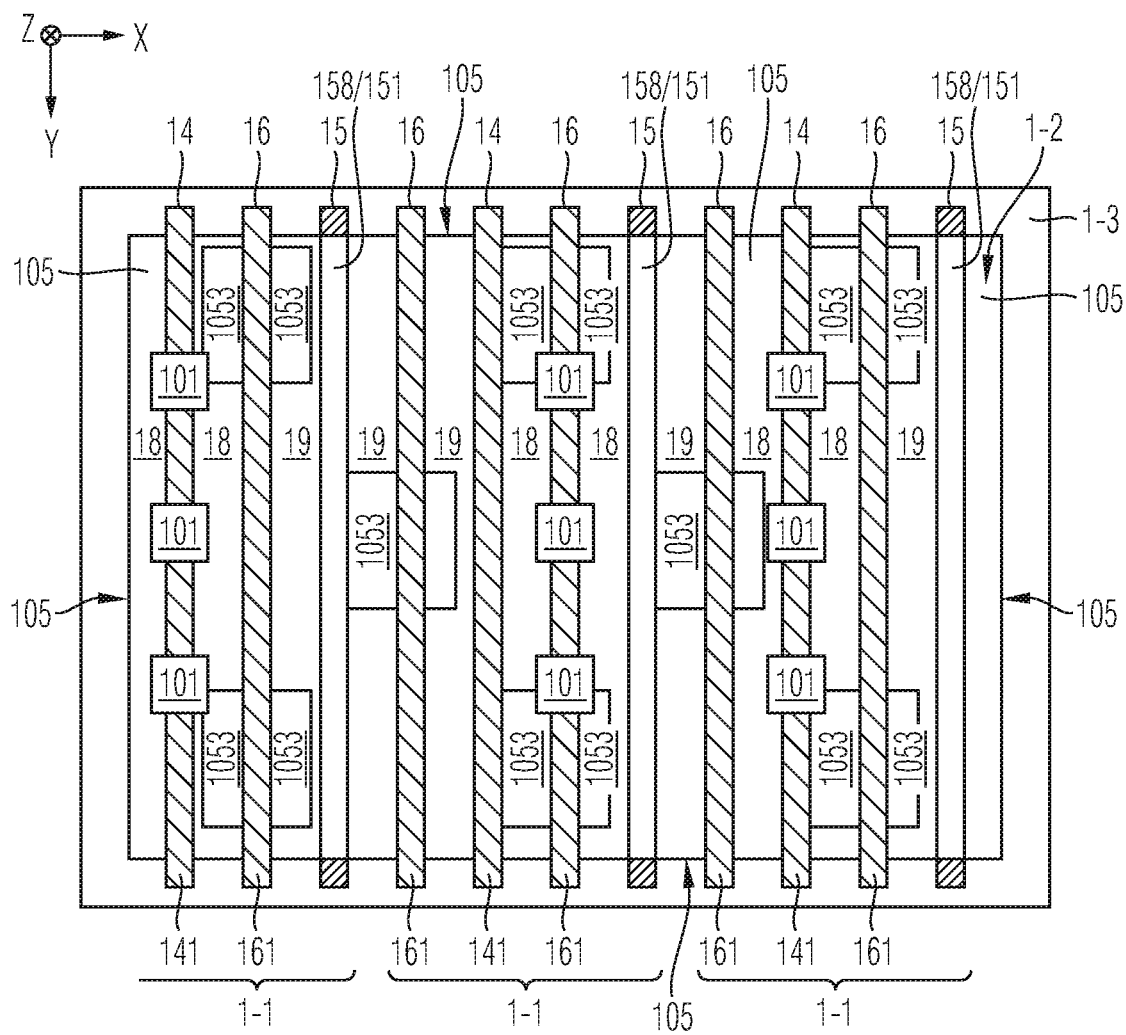
FIGS. 18-19 both schematically and exemplarily illustrate a section of a horizontal projection of a power semiconductor transistor in accordance with some embodiments.
Figure 19:
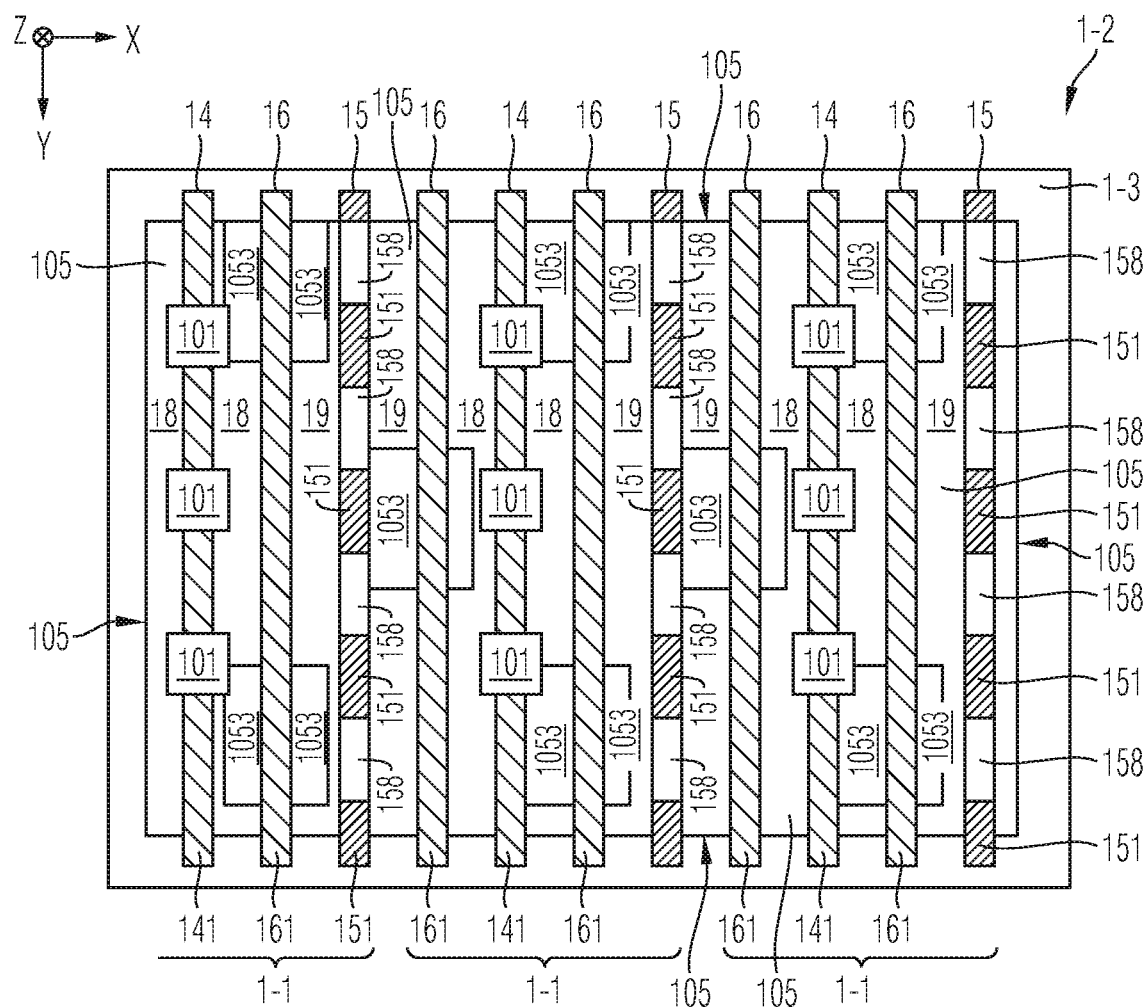

FIGS. 18 and 19 both schematically and exemplarily illustrate a section of a horizontal projection of the power semiconductor transistor 1 in accordance with some embodiments. They show the entire active region 1-2 surrounded by the inactive termination structure 1-3 and three power unit cells 1-1; of course, these power unit cells 1-1 are shown in an extremely exaggerated scale for illustrative purposes, and the transistor 1 can comprise far more than three power unit cells 1-1, as pointed out already in more detail above.

The power unit cells 1-1 of the transistor 1, e.g., an IGBT, exhibit for example, the contacting scheme "SkGkSoDo".

For example, as illustrated, the optional barrier region 105 extends throughout the entire active region 1-2, in particular to form the lateral overlap with the active mesas 18 and the dummy trench bottoms 155. The optional barrier region 105 exhibits the recesses 1053 distributed within the active region 1-2. As illustrated, the source region 101 is laterally structured, e.g., only locally provided, e.g., in accordance with the position of the recesses 1053. For example, one or more of the source regions 101 laterally overlap, at least partially, with the recess 1053.

For example, in accordance with the embodiment illustrated in FIGS. 18 and 19, at least one of the control trench 14 and the dummy trench 15 of each power unit cell 1-1, e.g., each trench 14, 15, 16 of each power unit cell 1-1, provides for said trench electrode volume reduction.

For example, in FIG. 18, each control trench 14 has the control trench electrode in the upper portion UP, and the second trench electrode 148 in the lower portion LP; and/or each dummy trench 15 has the dummy trench electrode 151 in the lower portion LP and the second trench electrode 158 in the upper portion UP; and/or each source trench 16 has the source trench electrode 161 in the lower portion LP and the second trench electrode 168 in the upper portion UP, e.g., in a manner as illustrated in FIG. 10. For example, the second trench electrodes 158 of the dummy trenches 15 are electrically connected to the first load terminal 11.

For example, in FIG. 19, each dummy trench 15 has several dummy trench electrodes 151 and several second trench electrodes 158 arranged in an alternating manner along the second lateral direction Y. For example, the second trench electrodes 158 of the dummy trenches 15 are electrically connected to the first load terminal 11. Further, in this variant, the other trenches 14 and 16 may be configured without respective second trench electrodes 148, 168. Further in accordance with the embodiment of FIG. 19, each dummy trench 15 has said total dummy trench volume, wherein the volume of the dummy trench electrode 151 amounts to less than 80% of the total dummy trench volume.

Figure 20:
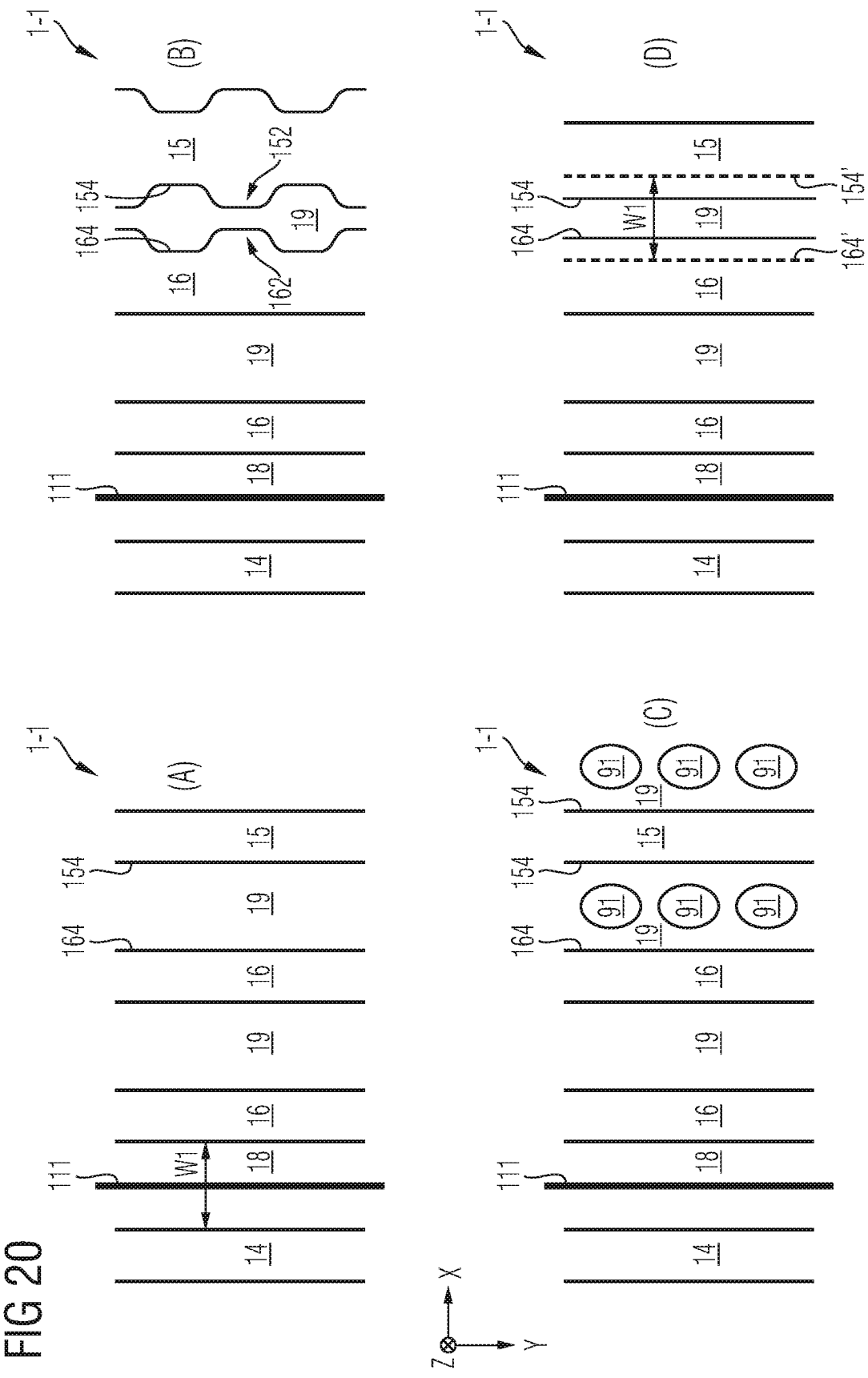

Now referring to FIGS. 20 to 22, further embodiment of the power semiconductor transistor 1 are described. According to these embodiments, the power semiconductor transistor 1 comprises a semiconductor body 10 coupled to a first load terminal 11 and a second load terminal 12 of the transistor 1 and comprising a drift region of a first conductivity type 100 configured to conduct a load current between said terminals 11, 12; and at least one power unit cell 1-1, including: at least one first trench (14; 15) having a first trench electrode (141; 151) coupled to a control terminal 13 of the transistor 1; at least one source trench 16 having a source trench electrode 161 electrically connected to the first load terminal 11; at least one first mesa (18; 19) spatially confined, along a first lateral direction X by means of a sidewall (144; 154) of the first trench (14; 15) and a sidewall 164 of the source trench 16; an optional semiconductor barrier region 105 of a second conductivity type implemented in the semiconductor body 10, the optional barrier region 105 laterally overlapping with both the first mesa (18; 19) and a bottom 165 of the source trench 16. The optional barrier region instead may be omitted. Each of the first trench (14; 15), the source trench 16 and the first mesa 18 exhibit a respective stripe configuration having a greater total extension in a second lateral direction Y than in the first lateral direction X, a nominal mesa width in the first lateral direction X being the maximum distance between the first trench sidewall (144; 154) and the source trench sidewall 164. For at least 10% of the total extension of the first mesa in the second lateral direction Y, and in a respective vertical cross-section (X,Z) of the first mesa, at least 50% of a nominal cross-sectional area is formed by an insulating material, the nominal cross-sectional area being defined by the nominal mesa width and a depth of the first trench (14; 15).

Correspondingly, herein presented is also a further method of processing power semiconductor transistor. The power semiconductor transistor comprises a semiconductor body coupled to a first load terminal and a second load terminal of the transistor and comprising a drift region of a first conductivity type configured to conduct a load current between said terminals. The method comprises forming at least one power unit cell, the at least one power unit cell including at least one first trench having a first trench electrode coupled to a control terminal of the transistor; at least one source trench having a source trench electrode electrically connected to the first load terminal; at least one first mesa spatially confined, along a first lateral direction by means of a sidewall of the first trench and a sidewall of the source trench; a semiconductor barrier region of a second conductivity type implemented in the semiconductor body, the barrier region laterally overlapping with both the first mesa and a bottom of the source trench. Each of the first trench, the source trench and the first mesa exhibit a respective stripe configuration having a greater total extension in a second lateral direction than in the first lateral direction, a nominal mesa width in the first lateral direction being the maximum distance between the first trench sidewall and the source trench sidewall. For at least 10% of the total extension of the first mesa in the second lateral direction, and in a respective vertical cross-section of the first mesa, at least 50% of a nominal cross-sectional area is formed by an insulating material, the nominal cross-sectional area being defined by the nominal mesa width and a depth of the first trench.

For example, the first trench mentioned above is a control trench 14 or a dummy trench 15. The first mesa can be an active mesa 18 or an inactive mesa 19.

For example, by reducing the portion of the semiconducting material in between the first trench having the first trench electrode coupled (e.g., electrically connected) to the control terminal 13 and the source trench 16 having the source trench electrode 161 electrically connected to the first load terminal 11, the capacitive coupling between the first load terminal 11 and the control terminal 13 may be adjusted, e.g., so to improve controllability of the transistor 1. To this end, the above indicated ranges of the at least 10% of the total extension of the first mesa in the second lateral direction Y and/or the at least 50% of the nominal cross-sectional area may be correspondingly modified, e.g., increased by from 10% to nearly 100% of the total extension of the first mesa in the second lateral direction Y; and/or from 50% to nearly 100% of the total extension of the first mesa in the second lateral direction Y.

At this point, it is again emphasized that the features of the embodiments already described above may equally apply to the embodiments described in the following, and vice versa. For example, with respect to FIGS. 20 to 22, mesas with a reduced semiconducting volume share will be exemplarily described. These exemplary mesas are not expressively illustrated in FIGS. 1 to 6, and 8 to 19; but, it shall be understood that also the embodiments described with respect to FIGS. 1 to 6, and 8 to 19 may exhibit reduced semiconducting volume share in the mesas as exemplarily described with respect to FIGS. 20 to 22. Vice versa, everything what has been stated above with respect to the first load terminal 11, the second load terminal 12, the control terminal the semiconductor body 10, the doped contact region 108, the drift region 100, the optional barrier region 105 (if included), the channel region 102, the source region 101, the pn-junctions 1052, 1051 and 1021, the plugs 111, the trenches 14, 15, 16, 17 and the mesas 18 and 19 etc. may equally apply to embodiments described in the following with respect to FIGS. 20 to 22.

In particular, even though not illustrated, the optional barrier region 105 may be present within the power unit cells 1-1 section-wise illustrated in FIGS. 20 to 22.

For example, the total extension in the second lateral direction Y of each of the first trench (14; 15), the source trench 16 and the first mesa (18; 19) is identical to the total extension of the active region 1-2 in the second lateral direction Y, as illustrated in FIG. 1.

The nominal mesa width in the first lateral direction X is, as indicated, the maximum distance between the first trench sidewall 144 and the source trench sidewall 164. For example, this nominal width is the maximum distance between the control trench sidewall 144 and the source trench sidewall 164 measured in the active mesa 18 at a vertical level where the channel region 102 is implemented (cf. width W1 in FIG. 22, section A). The nominal width W1 can be identical to the first width mentioned above, and may hence be within the range of 0.1 μm to 0.3 μm, within the range of 0.3 μm to 0.8 μm, or within the range of 0.8 μm to 1.4 μm.

The nominal cross-sectional area of the first mesa is defined by the nominal mesa width and a depth of the first trench (e.g., the control trench 14 or the dummy trench 15); e.g., the nominal cross-sectional area is obtained by multiplying the first trench depth (e.g., measured from the insulation layer 112 to the trench bottom 145/155) with the nominal mesa width.

For example, the depth of the first trench (e.g., the control trench 14 or the dummy trench 15) is constant along its total extension in the second lateral direction Y within the active region 1-2.

In section A, FIG. 20 illustrates an embodiment of the power unit cell 1-1 where no reduction of the volume of the semiconducting material in the mesas 18 and 19 is implemented; e.g., each mesa 18, 19 of the power unit cell 1-1 has a substantially constant width along its respective total extension in the second lateral direction Y, wherein the constant width may be identical to said nominal width W1 for each mesa 18, 19, and wherein each mesa 18, 19 may entirely be formed by the semiconducting material (e.g., by means of the source region 101, the channel region 102, the drift region 100 and/or the optional barrier region 105). That is, along the total extension in the second lateral direction Y, each nominal cross-sectional area is substantially entirely formed by the semiconducting material (disregarding an eventual contact plug (cf. reference numeral 111) that may slightly extend into the first mesa).

In contrast, referring to section B of FIG. 20, in the inactive mesa 19 between the source trench 16 (whose source trench electrode 161 may be electrically connected to the first load terminal 11) and the dummy trench 15 (whose dummy trench electrode 151 may be electrically connected to the control terminal 13), for at least 10% of the total extension of said inactive mesa) in the second lateral direction Y, and in the respective vertical cross-section (X,Z) of the inactive mesa 19, at least 50% of a nominal cross-sectional area is formed by an insulating material.

As illustrated in section B of FIG. 20, this may be achieved by locally widening at least one of the trench insulators 162, 152 (e.g., by providing oxide spacers) such that the mesa portions including the semiconducting material are reduced in volume.

Additionally or alternatively, as illustrated in section (C) of FIG. 20, one or more oxide needles 91 may be provided in the inactive mesa 19 between the dummy trench 15 and the source trench 16, wherein the oxide needles may have a maximum lateral extension, e.g., of at least 10% and at most 90% of the nominal width, and a depth of at least 10% and at most 90% of the control trench depth, in accordance with an embodiment.

As further emphasized in section D of FIG. 20, instead of only locally widening at least one of the trench insulators 162, 152 (as illustrated in section A), at least one of the trench insulators 162, 152 (e.g., both) may constantly be widened such that the mesa portions including the semiconducting material are more significantly reduced in volume. For example, the nominal width W1 present between the "regular" trench sidewalls 154' and 164' is decreased by at least 20% for at least contiguous 10% of the of the total extension of the inactive mesa 19 in the second lateral direction Y.

In accordance with the embodiment shown in FIG. 21, the at least one power unit cell 1-1 does not comprise a dummy trench 15; e.g., each power unit cell 1-1 comprises one control trench 14 and three source trenches 16, in between which there are arranged two inactive mesas 19 and one active mesa 18. For example, the first mesa where the reduction of the volume of the semiconducting material is implemented is the inactive mesa 19 between one of the source trenches 16 and the control trench 14 (and not the dummy trench 15, as in FIG. 20). The exemplary measures to implement the reduction of the volume of the semiconducting material as schematically illustrated in sections A, B and C of FIG. 21 correspond to those schematically illustrated in sections B, D and D, respectively, of FIG. 21. Thus, it is referred to the above.

The contacting scheme of the embodiments of the power unit cell 1-1 as schematically illustrated in FIG. 22 is identical to the scheme illustrated in FIG. 20. In contrast to FIG. 20, the first mesa where the reduction of the volume of the semiconducting material is implemented is the active mesa 18 (and not the inactive mesa) between one of the source trenches 16 and the control trench 14. The exemplary measures to implement the reduction of the volume of the semiconducting material as schematically illustrated in sections A, B of FIG. 22 correspond to those schematically illustrated in section B of FIG. 20, wherein section B of FIG. 22 shows that is also possible to locally widen only one of the relevant trenches 14, 16, e.g., only the control trench 14, as illustrated. The exemplary measure to implement the reduction of the volume of the semiconducting material as schematically illustrated in section C of FIG. 22 correspond to the measure as schematically illustrated in section C of FIG. 20, wherein, of course, the contact plugs 111 employed for contacting the active mesa 18 are spatially displaced from the oxide needles 91.

As emphasized above and here again, optional features and variants of the components of the IGBTs 1 illustrated section-wise in FIGS. 10 to 22 and their corresponding processing methods may correspond to those described above. For example, both the dummy trench electrode 151 and the control trench electrode 141 are electrically coupled to a control terminal 13 of the IGBT 1, wherein, e.g., the control terminal 13 may be electrically connected to an output of a driver unit (not illustrated) for driving the IGBT 1. For example, both the dummy trench electrode 151 and the control trench electrode 141 are electrically connected to the control terminal 13 of the IGBT 1, i.e., by means of a respective low ohmic connection (not illustrated). For example, the electrical potential of the dummy trench electrode 151 can be at least substantially identical to the electrical potential of the control trench electrode 141. In another embodiment, a first ohmic resistance between the control terminal 13 and the control trench electrode 141 may be different from a second ohmic resistance between the control terminal 13 and the dummy trench electrode 151. The difference between the first ohmic resistance and the second ohmic resistance may be within the range of 0Ω to 100Ω for example. For example, the second ohmic resistance is greater than the first ohmic resistance.

Figure 7:
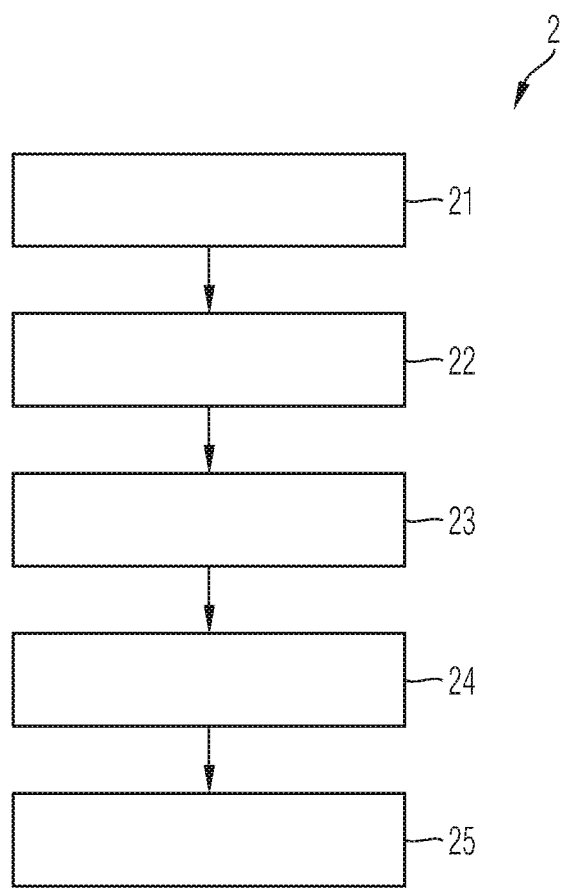
FIG. 7 schematically and exemplarily illustrates steps of a method of processing a power semiconductor transistor in accordance with one or more embodiments.

Regarding finally the illustration of FIG. 7, embodiments of a method 2 of processing a power semiconductor transistor are presented. For example, method 2 illustrated in FIG. 7 may be employed to manufacture one or more exemplary embodiments of the IGBT 1 described above, e.g., with respect to the other drawings.

According to an embodiment, method 2 is a method of processing a power semiconductor transistor. The transistor comprises a semiconductor body, provided in step 21, and coupled to a first load terminal and a second load terminal of the transistor and comprising a drift region of a first conductivity type configured to conduct a load current between said terminals. The method comprises forming at least one power unit cell. Forming the at least one power unit cell includes: forming, in step 22, at least one control trench having a control trench electrode; forming, in step 23, at least one dummy trench having a dummy trench electrode coupled to the control trench electrode; forming, in step 24, at least one active mesa comprising a source region of the first conductivity type and electrically connected to the first load terminal and a channel region of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the transistor and to control the load current in the active mesa; and forming, in step 25, a semiconductor barrier region of the second conductivity type implemented in the semiconductor body, the barrier region laterally overlapping with both the active mesa and a bottom of the dummy trench. The at least one control trench has a total control trench volume, the volume of the control trench electrode amounting to less than 80% of the total control trench volume; and/or the at least one dummy trench has a total dummy trench volume, the volume of the dummy trench electrode amounting to less than 80% of the total dummy trench volume.

For example, forming the optional barrier region 105 includes carrying out an implantation processing step. The implantation processing step can be carried out with an implantation energy within the range of 10 keV to 100 keV, and/or with an implantation dose within the range of 1 MeV to 3 MeV.

Further, the implantation processing step can be carried out as a self-aligned processing step, e.g., using recesses etched for the trenches as a mask, as described above.

Further embodiments of the method 2 correspond to the embodiments of the power semiconductor transistor described above with respect to the other drawings. Hence, for example, the features of the embodiments of the power semiconductor transistor described above with respect to the other drawings may be achieved by correspondingly carrying out the method 2.

In the above, embodiments pertaining to a power semiconductor transistor, such as an IGBT, and corresponding processing methods were explained. For example, these transistors are based on silicon (Si). Accordingly, a monocrystalline semiconductor region or layer, e.g., the semiconductor body 10 and its regions/zones 100, 101, 102, 105 and 108 can be a monocrystalline Si-region or Si-layer. In other embodiments, polycrystalline or amorphous silicon may be employed.

It should, however, be understood that the semiconductor body 10 and its doped regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SIC) or silicon germanium (SiGe), binary, ternary or quaternary Ill-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGalnN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGalnN), indium gallium nitride (InGaN)-aluminum gallium indium nitride (AlGalnN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor device applications currently mainly Si, SiC, GaAs and GaN materials are used.

Spatially relative terms such as "under", "below", "above", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor transistor, comprising:
   a semiconductor body coupled to a first load terminal and a second load terminal of the power semiconductor transistor and comprising a drift region of a first conductivity type configured to conduct a load current between the first and the second load terminals; and
   a power unit cell comprising:
      a control trench having a control trench electrode and a dummy trench having a dummy trench electrode coupled to the control trench electrode;
      an active mesa comprising a source region of the first conductivity type and electrically connected to the first load terminal and a channel region of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the power semiconductor transistor and to control the load current in the active mesa;
      a barrier region of the second conductivity type formed in the semiconductor body and laterally overlapping with the active mesa and a bottom of the dummy trench,
      wherein the control trench has a total control trench volume and a volume of the control trench electrode is less than 80% of the total control trench volume, and/or the dummy trench has a total dummy trench volume and a volume of the dummy trench electrode is less than 80% of the total dummy trench volume,
      wherein the barrier region is electrically floating.

2. The power semiconductor transistor of claim 1, wherein the power unit cell further comprises an inactive mesa arranged adjacent to the dummy trench, and wherein a transition between the first load terminal and the inactive mesa provides an electrical insulation at least for charge carriers of the first conductivity type.

3. The power semiconductor transistor of claim 2, wherein the inactive mesa comprises, in an upper portion, an oxidized region vertically overlapping with the channel region.

4. The power semiconductor transistor of claim 1, wherein the bottom of the dummy trench and a bottom of the control trench extend into the barrier region.

5. The power semiconductor transistor of claim 1, wherein the barrier region laterally overlaps with the active mesa for at least 50% of a width of the active mesa.

6. The power semiconductor transistor of claim 1, wherein a remaining share of the total control trench volume and/or a remaining share of the total dummy trench volume is filled by an insulating material and/or an electrode material separated from the respective trench electrode.

7. The power semiconductor transistor of claim 1, wherein the dummy trench electrode is arranged in a lower portion of the dummy trench, the lower portion vertically overlapping with the barrier region.

8. The power semiconductor transistor of claim 1, wherein the dummy trench electrode does not vertically overlap with the channel region.

9. The power semiconductor transistor of claim 1, wherein the control trench electrode is arranged in an upper portion of the control trench, the upper portion vertically overlapping with the channel region.

10. The power semiconductor transistor of claim 1, wherein the dummy trench includes a second trench electrode.

11. The power semiconductor transistor of claim 10, wherein the second trench electrode of the dummy trench has a different electrical potential than the dummy trench electrode.

12. The power semiconductor transistor of claim 11, wherein the second trench electrode is arranged above the dummy trench electrode.

13. The power semiconductor transistor of claim 10, wherein the second trench electrode is arranged laterally adjacent to the dummy trench electrode.

14. The power semiconductor transistor of claim 1, wherein the power semiconductor transistor comprises a plurality of power unit cells, and wherein the barrier region connects:
  inactive mesas included in the plurality of power unit cells with each other; and/or
  two or more dummy trench bottoms with each other.

15. The power semiconductor transistor of claim 1, wherein:
  both the control trench electrode and the dummy trench electrode are electrically coupled to the control terminal; and/or
  the barrier region is configured to provide for an electrically conductive path between a section of the active mesa and the bottom of the dummy trench; and/or
  the barrier region is a contiguous barrier layer within an active region of the power semiconductor transistor.

16. A power semiconductor transistor, comprising:
  a semiconductor body coupled to a first load terminal and a second load terminal of the power semiconductor transistor and comprising a drift region of a first conductivity type configured to conduct a load current between the first and the second load terminals; and
  a power unit cell comprising:
    a control trench having a control trench electrode and a dummy trench having a dummy trench electrode coupled to the control trench electrode; and
    an active mesa comprising a source region of the first conductivity type and electrically connected to the first load terminal and a channel region of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the power semiconductor transistor and to control the load current in the active mesa; and
    an inactive mesa arranged adjacent to the dummy trench, and wherein a transition between the first load terminal and the inactive mesa provides an electrical insulation at least for charge carriers of the first conductivity type,
  wherein the dummy trench has a total dummy trench volume and a volume of the dummy trench electrode is less than 80% of the total dummy trench volume, and
  wherein the inactive mesa comprises, in an upper portion, an oxidized region vertically overlapping with the channel region.

17. A power semiconductor transistor, comprising:
  a semiconductor body coupled to a first load terminal and a second load terminal of the power semiconductor transistor and comprising a drift region of a first conductivity type configured to conduct a load current between the first and the second load terminals; and
  a power unit cell comprising:
    a control trench having a control trench electrode and a dummy trench having a dummy trench electrode coupled to the control trench electrode;
    an active mesa comprising a source region of the first conductivity type and electrically connected to the first load terminal and a channel region of a second conductivity type and separating the source region and the drift region, wherein, in the active mesa, at least a respective section of each of the source region, the channel region and the drift region are arranged adjacent to a sidewall of the control trench, and wherein the control trench electrode is configured to receive a control signal from a control terminal of the power semiconductor transistor and to control the load current in the active mesa;
    a barrier region of the second conductivity type formed in the semiconductor body and laterally overlapping with the active mesa and a bottom of the dummy trench,
  wherein the source region is laterally structured along a second lateral direction with intermission regions separating adjacent source subregions, and wherein the control trench electrode is laterally structured along the second lateral direction according to a lateral structure of the source region to laterally overlap with the source subregions.

* * * * *